(12) United States Patent
Narui et al.

(10) Patent No.: US 9,412,432 B2
(45) Date of Patent: Aug. 9, 2016

(54) SEMICONDUCTOR STORAGE DEVICE AND SYSTEM PROVIDED WITH SAME

(71) Applicant: PS4 Luxco S.a.r.l., Luxembourg (LU)

(72) Inventors: Seiji Narui, Tokyo (JP); Hiromasa Noda, Tokyo (JP); Chiaki Dono, Tokyo (JP); Chikara Kondo, Tokyo (JP); Masayuki Nakamura, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/776,056

(22) PCT Filed: Mar. 13, 2014

(86) PCT No.: PCT/JP2014/056720
§ 371 (c)(1),
(2) Date: Sep. 14, 2015

(87) PCT Pub. No.: WO2014/142254
PCT Pub. Date: Sep. 18, 2014

(65) Prior Publication Data
US 2016/0042782 A1     Feb. 11, 2016

(30) Foreign Application Priority Data
Mar. 15, 2013 (JP) ................................. 2013-053017

(51) Int. Cl.
*G11C 7/00* (2006.01)
*G11C 11/406* (2006.01)
*G11C 11/408* (2006.01)

(52) U.S. Cl.
CPC .......... *G11C 11/406* (2013.01); *G11C 11/4087* (2013.01); *G11C 11/40611* (2013.01); *G11C 2211/4065* (2013.01)

(58) Field of Classification Search
CPC ........... G11C 11/406; G11C 11/40611; G11C 2211/4065
USPC ................ 365/222, 149, 186, 230.01, 230.06
See application file for complete search history.

(56) References Cited

U.S. PATENT DOCUMENTS 6,515,928 B2 * 2/2003 Sato ..................... G11C 7/1045
365/222
9,158,672 B1 * 10/2015 Zheng ................. G06F 12/0246

(Continued)

FOREIGN PATENT DOCUMENTS

JP    2011164669    8/2011
JP    2013004158    7/2013

OTHER PUBLICATIONS

Application No. PCT/JP2014/056720, International Search Report, Jun. 24, 2014.

*Primary Examiner* — Fernando Hidalgo
(74) *Attorney, Agent, or Firm* — Kunzler Law Group, PC

(57) ABSTRACT

A semiconductor storage device is provided with a memory cell array comprising a plurality of word lines including word lines that are adjacent to one another; and a TRR address conversion unit that selects the word line in response to the input of an address signal indicating a first value while in a first operation mode and selects the word line in response to the input of an address signal indicating a first value while in a target row refresh mode. Due to the fact that address conversion is performed on the semiconductor storage device side in the present invention, it is sufficient for a control device to output, for example, the address of a word line having a high access count to the semiconductor storage device during a target row refresh operation. As a result, control of the target row refresh operation on the control device side is facilitated.

15 Claims, 19 Drawing Sheets

(56) References Cited

U.S. PATENT DOCUMENTS

| | | |
|---|---|---|
| 2007/0153619 A1 | 7/2007 | Choo et al. |
| 2011/0122687 A1 | 5/2011 | Kwon et al. |
| 2013/0304982 A1 | 11/2013 | Jung et al. |
| 2014/0281332 A1* | 9/2014 | Koob ................ G06F 12/10 711/170 |

* cited by examiner

SEMICONDUCTOR STORAGE DEVICE AND SYSTEM PROVIDED WITH SAME

TECHNICAL FIELD

The present invention relates to a semiconductor memory device and a system provided with the same, and more particularly to a semiconductor memory device in which information must be preserved using refresh operations and to a system provided with the same.

BACKGROUND ART

Dynamic random access memory (DRAM) is a representative example of a semiconductor memory device. In DRAM, information is stored as electric charges on cell capacitors, and therefore the information will eventually be lost if the electric charges are not periodically refreshed. To achieve this, a control device that controls the DRAM device periodically issues a refresh command that tells the DRAM device to perform a refresh operation (see Patent Document 1). The control device issues the refresh command at a frequency that ensures all of the word lines are refreshed once per refresh cycle (which lasts 64 msec, for example).

RELATED ART DOCUMENT

Patent Document

Patent Document 1: Japanese Patent Application Laid-Open Publication No. 2011-258259

SUMMARY

However, depending on the history of access to the memory cells, the data storage properties of certain memory cells may deteriorate over time. If the data storage time of such memory cells falls below the refresh cycle time, some information may be lost even if the refresh command is issued at a frequency that ensures that all of the word lines are refreshed once per refresh cycle.

To combat this problem, in recent years technologies that utilize the memory cell access history to restore the appropriate electric charges to memory cells in which the data storage properties have deteriorated have been researched.

The present invention provides a specific means for realizing such a technology in a semiconductor memory device and a system provided with the same.

One example of the present invention proposes a method for converting addresses within the semiconductor memory device when a target row refresh mode is enabled.

One aspect of the present invention is a semiconductor memory device, including: a memory array having a plurality of word lines; a row decoder circuit that receives a first address and specifies a corresponding first word line of the plurality of word lines, receives a second address and specifies a corresponding second word line of the plurality of word lines, and receives a third address and specifies a corresponding third word line of the plurality of word lines; and a first circuit that receives address information that includes the first address and the second address, characterized in that when a target row refresh signal has not been issued, the first circuit receives the first address and outputs that first address to the row decoder circuit and then receives the second address and outputs that second address to the row decoder circuit, and when a target row refresh signal has been issued, the first circuit receives the first address and outputs the third address to the row decoder circuit.

Another aspect of the present invention is a system, including: the abovementioned semiconductor memory device; and controllers that output the target row refresh signal and the address information to the semiconductor memory device.

Yet another aspect of the present invention is a semiconductor memory device, including: a memory cell array having a plurality of word lines including a first and second word line arranged adjacent to one another; and an address conversion circuit that selects the first word line when an address signal that represents a first value is input when the semiconductor memory device is in a first operation mode and that selects the second word line when an address signal that represents the first value is input when the semiconductor memory device is in a target row refresh mode.

The present invention utilizes the memory cell access history to restore the appropriate electric charges to memory cells in which the data storage properties have deteriorated.

More specifically, the semiconductor memory device performs address conversion to achieve this. Moreover, because the semiconductor memory device performs the address conversion, the control device only has to output the addresses of word lines with a high access count to the semiconductor memory device during a target row refresh, for example. This simplifies the target row refresh process on the control device side.

BRIEF DESCRIPTION OF THE DRAWINGS

FIG. 6 depicts a case in which during a target row refresh operation, the controller only supplies the address of the word line that caused a disturbance.

FIG. 8 depicts a case in which during a target row refresh operation, the controller supplies the address of the word line that caused a disturbance as well as the addresses of word lines that need an additional refresh.

DETAILED DESCRIPTION OF EMBODIMENTS

Preferred embodiments of the present invention will be described in detail below with reference to the attached drawings.

Figure 1:
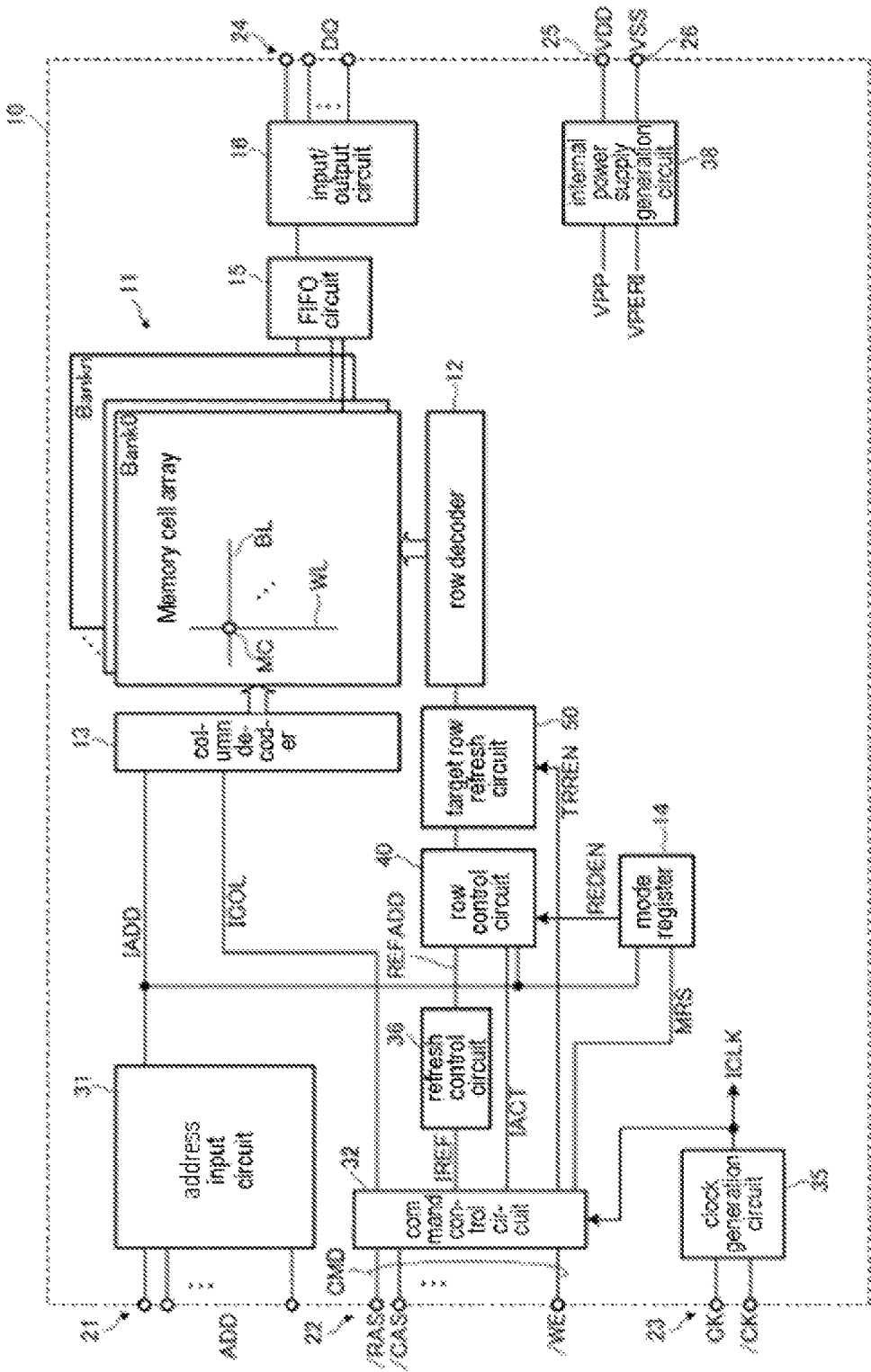
FIG. 1 is a block diagram illustrating an overall configuration of a semiconductor memory device 10 according to a preferred embodiment of the present invention.

FIG. 1 is a block diagram illustrating an overall configuration of a semiconductor memory device 10 according to a preferred embodiment of the present invention.

The semiconductor memory device 10 according to the present embodiment is a single-chip double data rate fourth generation (DDR4) DRAM device. As illustrated in FIG. 1, the semiconductor memory device 10 includes a memory cell array 11. The memory cell array 11 includes a plurality of word lines WL, a plurality of bit lines BL, and a plurality of memory cells MC arranged at the intersections between the word lines WL and the bit lines BL. A row decoder 12 selects the word lines WL, and a column decoder 13 selects the bit lines BL. Although the configuration of the memory cell array 11 is not particularly limited, in the present embodiment the memory cell array 11 is divided into n+1 banks. Here, a "bank" refers to a group of memory cells on which a command can be executed independently. In general, operations can be performed non-exclusively or between banks.

Moreover, the semiconductor memory device 10 includes the following external terminals: address terminals 21, command terminals 22, clock terminals 23, data terminals 24, and power supply terminals 25 and 26.

The address terminal 21 receives an externally input address signal ADD. Address signals ADD input to the address terminal 21 proceed through an address input circuit 31 and are sent to a row control circuit 40, the column decoder 13, or a mode register 14. The configuration of the row control circuit 40 will be described in more detail later. The row control circuit 40 sends row addresses to the row decoder 12 via a target row refresh circuit 50.

The mode register 14 is a circuit that stores a parameter that determines the operation mode of the semiconductor memory device 10. One of the parameters that can be set to the mode register 14 is target row refresh-enabled mode. This setting is recognized by a command control circuit 32 (main control circuit 34) that then outputs a target row refresh enable signal TRREN. Note that the target row refresh enable signal TRREN may also be configured such that a mode register set signal MRS is also generated.

Moreover, redundant operation refers to a state in which redundant word lines can be used instead of a defective word line WL. In DRAM memory, redundant operation is typically always active. FIG. 1 depicts a different example for purposes of explanation. In FIG. 1, redundant operation is enabled/disabled using a redundancy enable signal REDEN. The mode register 14 manages whether redundancy is currently enabled. The command control circuit 32 (main control circuit 34) recognizes this from the mode register 14 and may output the redundancy enable signal REDEN as appropriate. Furthermore, in another example the mode register 14 does not have to manage the current redundant operation state. Instead, the state may be managed by a control circuit such as the command control circuit 32 (main control circuit 34) or a redundancy determination circuit 44, and the redundancy enable signal REDEN may be generated by one of those control circuits when a memory cell is accessed.

Figure 2:
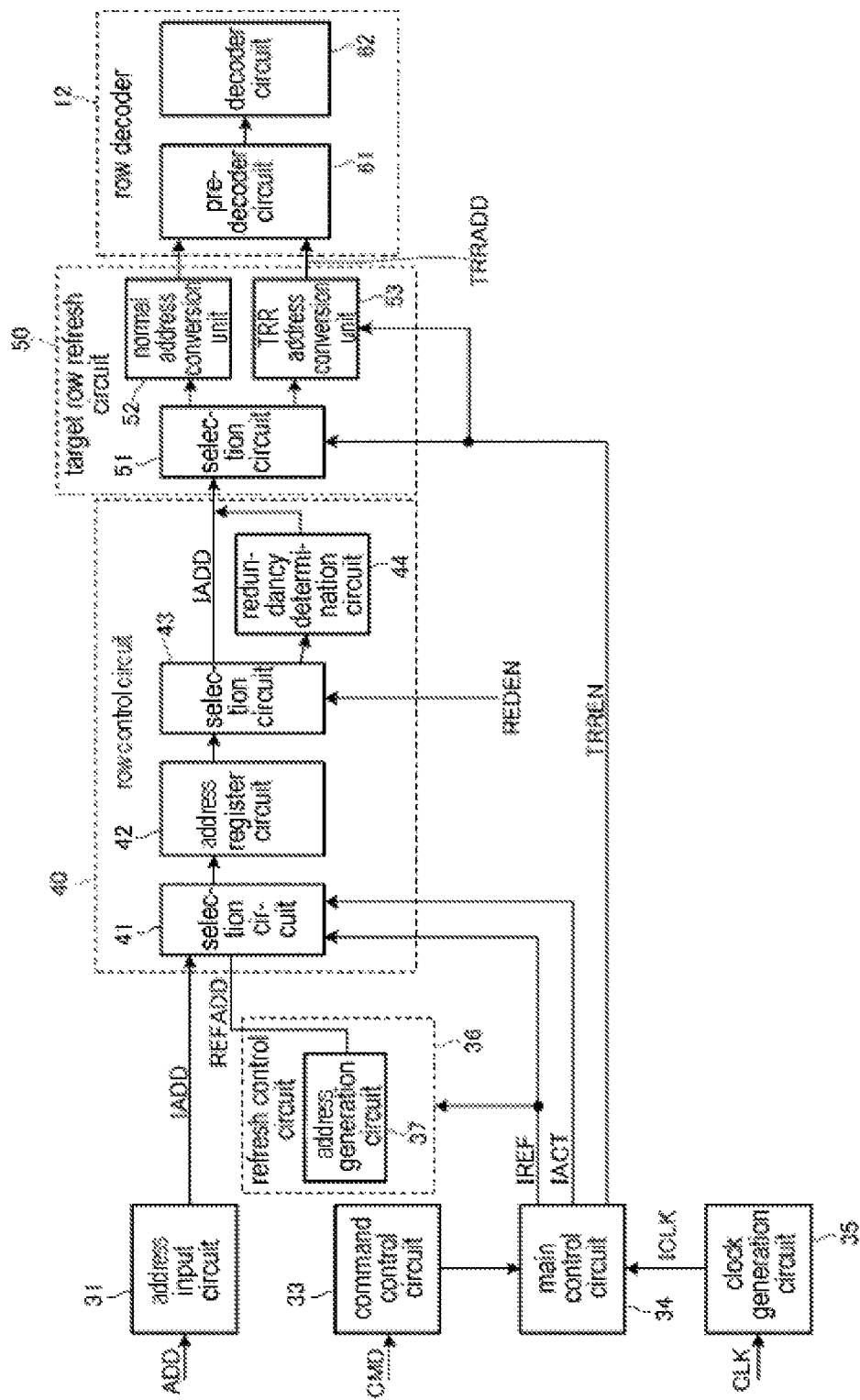
FIG. 2 is a block diagram illustrating only the primary components of the semiconductor memory device 10.

The command terminal 22 receives signals such as a row address strobe signal /RAS, a column address strobe signal /CAS, or a write enable signal /WE. These command signals CMD are then sent to the command control circuit 32. As illustrated in FIG. 2, the command control circuit 32 includes a command input circuit 33 that receives the command signals CMD and a main control circuit 34 that generates the appropriate internal signals according to the command signals CMD received. The internal signals that can be generated by the main control circuit 34 include the following: an active signal IACT, a column signal ICOL, a refresh signal IREF, the mode register set signal MRS, and the target row refresh enable signal TRREN that is generated after referencing the mode register 14, for example. Note that the target row refresh enable signal TRREN may also be generated and input to the target row refresh circuit by the mode register, for example.

The active signal IACT is issued when the received command signal CMD is an active command that results in access to a row. Once the active signal IACT is issued, an address signal IADD input to the address input circuit 31 is sent to the row control circuit 40. The address signal IADD is then sent to the row decoder 12 via the row control circuit 40 and the target row refresh circuit 50. The word line WL corresponding to the specified address signal IADD is then selected.

The column signal ICOL is issued when the received command signal CMD is a read command or write command that results in access to a column. Once the internal column signal ICOL is issued, an address signal IADD from the address input circuit 31 is sent to the column decoder 13. The bit line BL corresponding to the specified address signal IADD is then selected.

Therefore, to read data, an active command and a read command are input together with a row address and a column address. The read data stored in the memory cell MC specified by this row address and column address is then read therefrom. The read data DQ read from the memory cell MC is then sent via a FIFO circuit 15 and an input/output circuit 16 to a data terminal 24 for output to outside of the device.

Meanwhile, to write data, an active command and a write command are input together with a row address and a column address, and then the write data DQ is input to the data terminal 24. The write data DQ is then sent via the input/output circuit 16 and the FIFO circuit 15 to the memory cell array 11 and written to the memory cell MC corresponding to the specified row address and column address.

The refresh signal IREF is issued when the received command signal CMD is a refresh command. The refresh signal IREF is sent to a refresh control circuit 36. The refresh control circuit 36 sends a refresh address REFADD to the row control circuit 40 to activate a prescribed word line WL in the memory cell array 11, thereby refreshing that word line WL. As illustrated in FIG. 2, the refresh address REFADD is generated by an address generation circuit 37 that is part of the refresh control circuit 36.

Here, the refresh operation controlled by the refresh control circuit 36 is a different type of refresh operation than the target refresh operation. In other words, the target refresh operation is a different operation than the auto-refresh and cell refresh operations built into the DRAM device.

The mode register set signal MRS is issued when the received command signal CMD is a mode register set command. The settings of the mode register 14 can be configured by inputting a mode register set command together with a mode signal input from the address terminal 21.

The target row refresh enable signal TRREN is issued when the received MRS indicates the target row refresh state (the high level state, for example). The target row refresh state is enabled according to control signals input from the controller to configure a register at a prescribed location within the mode register that indicates the target row refresh state. The target row refresh enable signal TRREN is then sent to the target row refresh circuit 50. Next, the configuration and operation of the target row refresh circuit 50 will be described.

As described above, the external terminals of the semiconductor memory device 10 include clock terminals 23 to which external clock signals CK and /CK are input. The external clock signals CK and the external clock signals /CK are complementary. A clock generation circuit 35 generates an internal clock signal ICLK based on the external clock signals CK and /CK and sends this internal clock signal ICLK to the appropriate circuits.

The power supply terminals 25 and 26 are used to provide supply voltages VDD and VSS, respectively. The supply voltages VDD and VSS supplied via the power supply terminals 25 and 26 are sent to an internal power supply generation circuit 38. The internal power supply generation circuit 38 generates internal voltages VPP, VPERI, and the like using the supply voltages VDD and VSS. The internal voltage VPP is used primarily as the high voltage level in the row decoder 12, and the internal voltage VPERI is used as a lower-level voltage in most of the other circuits.

In conventional DRAM memory cells, the data storage properties of certain memory cells may deteriorate over time according to the history of access to those cells. If the data storage time of such memory cells falls below the refresh cycle time, some information may be lost even if the refresh command is issued at a frequency that ensures that all of the word lines are refreshed once per refresh cycle. In order to solve this problem, the present invention provides a specific method for implementing a new feature called a target row refresh in a semiconductor memory device 10 and a system provided with the same.

Target row refresh refers to a technology for using the access history to issue a suitable row access command from a control device to memory cells in which the data storage properties have deteriorated in order to restore the electric charges on the corresponding cell capacitors. This technology will be described in detail below. The configuration described below is particularly useful for cases in which the logical addresses and the physical addresses of the word lines do not necessarily match.

FIG. 2 is a block diagram illustrating only the primary components of the semiconductor memory device 10 according to the present embodiment.

As illustrated in FIG. 2, the row control circuit 40 includes a selection circuit 41. The selection circuit 41 selects either an address signal IADD or a refresh address REFADD according to the received active signal IACT and refresh signal IREF. More specifically, the selection circuit 41 selects the address signal IADD if an active signal IACT was issued and selects the refresh address REFADD if a refresh signal IREF was issued. The selected address signal IADD or refresh address REFADD is then sent to an address register circuit 42. The description below corresponds to a case in which the selection circuit 41 selected an address signal IADD.

In DRAM memory, redundant operation is typically always enabled. Therefore, addresses stored in the address register circuit 42 may be output as-is to the target row refresh circuit 50 or may be output to the target row refresh circuit 50 via a redundancy determination circuit 44. More specifically, if the specified address is defective, the redundancy determination circuit 44 outputs an address signal that represents a redundant address. If the specified address is not defective, the redundancy determination circuit 44 simply outputs the address signal IADD as-is.

FIG. 2 depicts a different example for purposes of explanation that includes a selection circuit 43 and a redundancy determination circuit 44. In this example, redundant operation can be switched between an enabled state and a disabled state. An address stored in the address register circuit 42 is sent to the selection circuit 43. The selection circuit 43 selects whether to output the address stored in the address register circuit 42 as-is to the target row refresh circuit 50 or output the address to the target row refresh circuit 50 via the redundancy determination circuit 44. This selection is controlled using a redundancy enable signal REDEN. More specifically, when the redundant operation mode is enabled, the address is sent via the redundancy determination circuit 44. When the redundant operation mode is disabled, the redundancy determination circuit 44 is bypassed.

The redundancy determination circuit 44 stores the logical addresses (defective addresses) of defective word lines WL. If the input address matches one of the defective addresses stored in the redundancy determination circuit 44, the redundancy determination circuit 44 converts the address to the logical address of a spare (redundant) word line WL and outputs that address. This operation converts a row access operation to a defective word line WL to a row access operation to the corresponding spare (redundant) word line WL.

In this way, the row control circuit 40 handles address selection and conversion and outputs the selected or converted address signal IADD to the target row refresh circuit 50.

As illustrated in FIG. 2, the target row refresh circuit 50 includes a selection circuit 51. When the target row refresh enable signal TRREN has not been issued (that is, during normal operation), the selection circuit 51 sends the input address signal IADD to a normal address conversion unit 52. When the target row refresh enable signal TRREN has been issued (that is, during a target row refresh operation), the selection circuit 51 sends the input address signal IADD to a TRR address conversion unit 53. When the target row refresh enable signal TRREN has not been issued, the row decoder 12 takes the address from the normal address conversion unit 52. When the target row refresh enable signal TRREN has been issued, the row decoder 12 takes the address from the TRR address conversion unit 53.

The normal address conversion unit 52 is a circuit that converts the input logical address to a physical address. This is necessary because the logical addresses and physical addresses do not match exactly. In configurations in which the logical addresses and physical addresses do match exactly, however, the normal address conversion unit 52 can be removed. Depending on the configuration of the row decoder, it may also be possible to remove the normal address conversion unit 52 even when the logical addresses and physical addresses do not match exactly.

The TRR address conversion unit 53 is a circuit that takes the input logical address and generates a prescribed physical address different than the physical address that actually corresponds to that logical address. Here, "a prescribed physical address" refers to the physical address of a word line WL to be refreshed during a target row refresh operation. In the present specification and drawings, this address signal is distinguished from the address signal IADD using the reference character TRRADD.

The physical address output from the target row refresh circuit 50 is then sent to the row decoder 12. The row decoder 12 includes a pre-decoder circuit 61 and a decoder circuit 62 to perform this decoding operation.

Next, the reasons why a target row refresh may be necessary and the reasons why address conversion using the TRR address conversion unit 53 may be necessary will be described.

Figure 3:
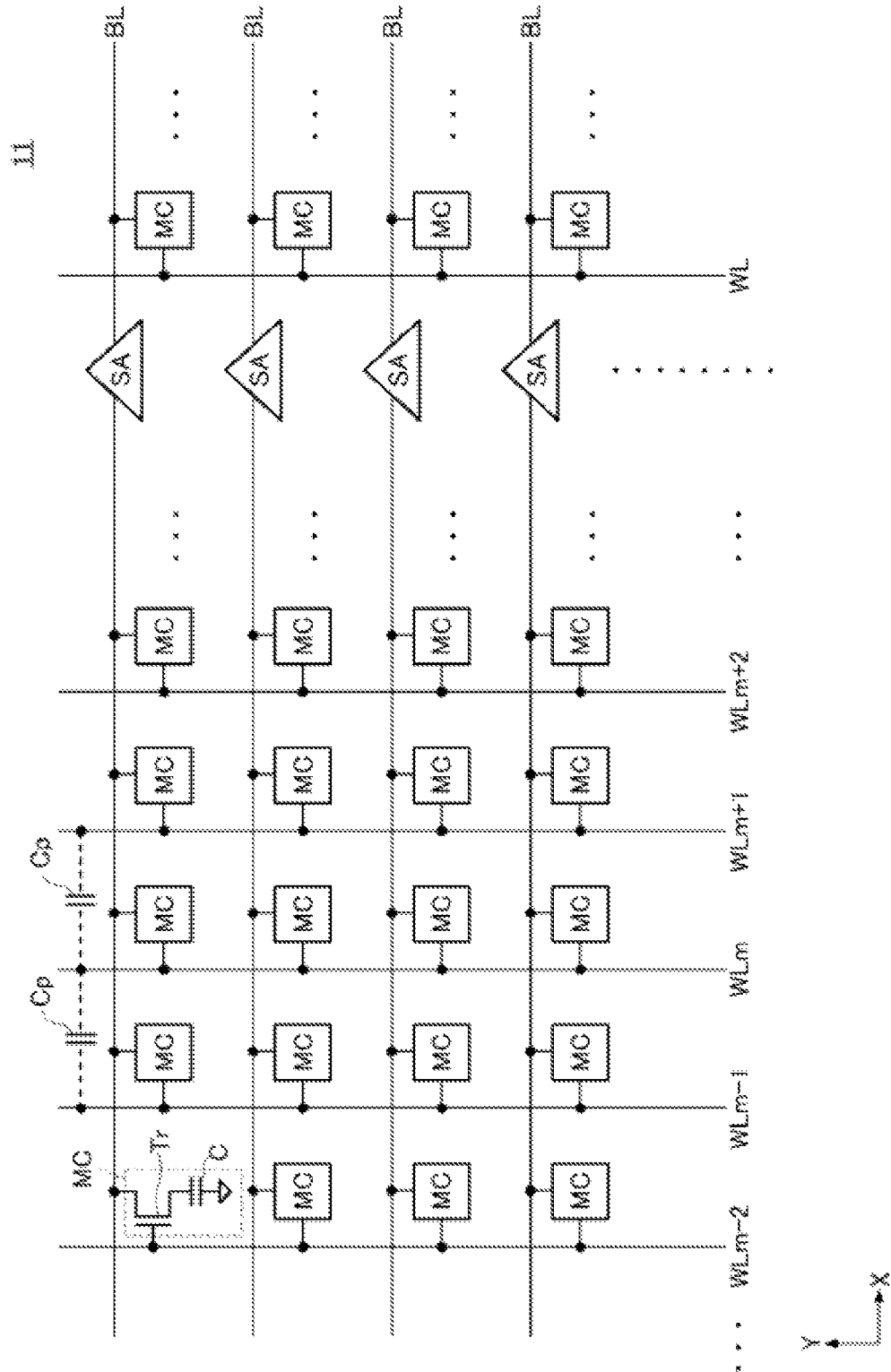
FIG. 3 is an enlarged circuit diagram of a portion of a memory cell array 11 according to Embodiment 1 of the present invention.

FIG. 3 is an enlarged circuit diagram of a portion of the memory cell array 11 according to Embodiment 1 of the present invention.

As illustrated in FIG. 3, The memory cell array 11 includes a plurality of word lines WL that run in the Y direction, a plurality of bit lines BL that run in the X direction, and a plurality of memory cells MC arranged at the intersections between the word lines WL and the bit lines BL. The memory cells MC are so-called DRAM cells, and each includes a cell transistor Tr made using an n-channel MOS transistor that is connected in series to a cell capacitor C. The gate electrode of the cell transistor Tr is connected to the corresponding word line WL, and either the source electrode or the drain electrode is connected to the corresponding bit line BL. The other source/drain electrode is connected to the cell capacitor C.

Each memory cell MC stores data using an electrical charge stored on the cell capacitor C. More specifically, the cell capacitor C is charged using an internal voltage VARY (that is, a high level voltage) to store one logical level (a logical value of 1, for example), and the cell capacitor C is charged using a ground voltage VSS (that is, a low level voltage) to store the other logical level (a logical value of 0, for example). The charge stored on the cell capacitor C gradually degrades over time due to leak currents and must therefore be periodically refreshed after a prescribed period of time has elapsed.

This refresh operation is essentially the same as a standard row access operation performed by issuing an active signal IACT. In other words, the word line WL that should be refreshed is driven at an active level to turn the cell transistors Tr connected to that word line WL on. The active level for the word lines WL may be the internal voltage VPP, for example, which is higher than the internal voltage VPERI used for the majority of the peripheral circuits. The cell capacitors C are connected to the respective bit lines BL, and therefore the voltage applied to the bit lines BL changes according to the charges stored on the cell capacitors C. Next, sense amplifiers SA are activated to amplify the voltage differences between pairs of bit lines BL, and the word lines WL are returned to the inactive level to restore the charges of the cell capacitors C.

The inactive level for the word lines WL may be a negative voltage VKK that is less than the ground voltage VSS, for example.

The period after which a refresh should be performed is known as the refresh cycle. One standard defined in the industry is 64 msec, for example. As long as the data storage time of each memory cell MC is longer than the refresh cycle, the memory cells MC can continue to satisfactorily store data if a refresh operation is performed periodically. In practice, memory cells MC are typically designed to have a data storage time that exceeds the refresh cycle by a sufficient margin, and therefore, the memory cells MC can store data correctly even if refreshed using a refresh cycle that is slightly longer than the standard refresh cycle.

However, in recent years, so-called disturbances in which the data storage time of the memory cells MC deteriorates according to the history of access to those memory cells MC have become a problem. These disturbances refer to a phenomenon in which repeated access to a certain word line WL causes the data storage properties of memory cells MC connected to adjacent word lines WL to deteriorate. In FIG. 3, for example, repeated access to the word line WLm would cause the data storage properties of the memory cells MC connected to the adjacent word lines WLm−1 and WLm+1 to deteriorate. There are various theories as to why this occurs. One theory proposes that this deterioration occurs due to parasitic capacitance Cp that forms between adjacent word lines. A second theory proposes a model in which this deterioration occurs due to generation of minority carriers during the repeated switching of the word lines between the high and low voltage levels and subsequent absorption of the charge carriers from the other memory cells.

According to the first theory, repeated access to the prescribed word line WLm results in repeated changes from the negative voltage VKK to the high voltage VPP. As a result of the electrical coupling between the word line WLm and the adjacent word lines WLm−1 and WLm+1 due to the parasitic capacitance Cp, the adjacent word lines experience a slight voltage increase even if held fixed at the negative voltage VKK. This increases the magnitude of the off-leakage currents in the cell transistors Tr connected to the word lines WLm−1 and WLm+1, which causes the charges on the cell capacitors C to dissipate faster than normal.

Figure 4:
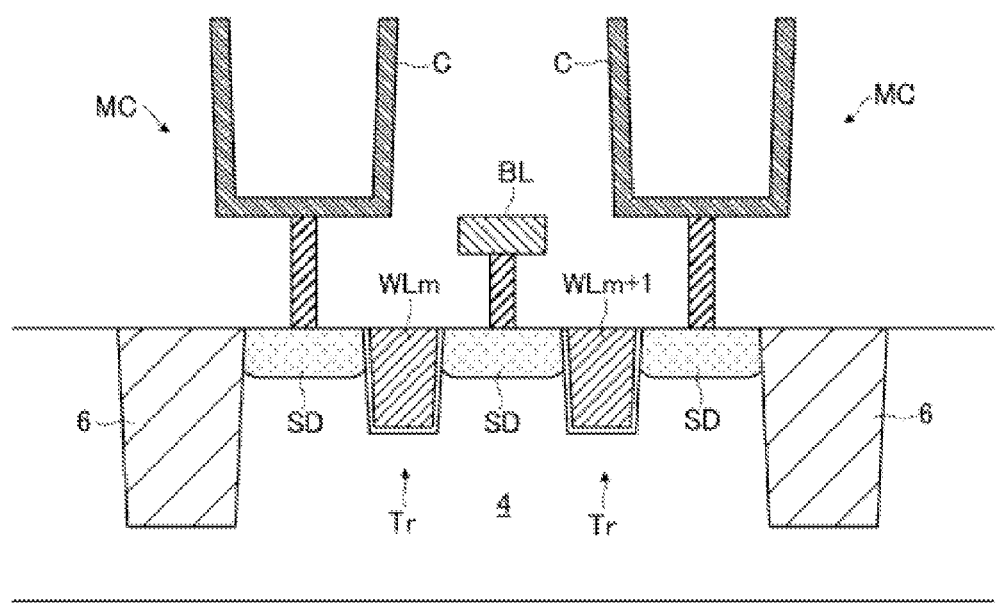
FIG. 4 is a cross-sectional view of two memory cells MC that share a bit line. Each memory cell includes a trench gate cell transistor Tr in which a word line WL is embedded in a semiconductor substrate 4.

Moreover, the second theory offers the following explanation. FIG. 4 is a cross-sectional view of two memory cells MC that share a bit line. Each memory cell includes a trench gate cell transistor Tr in which a word line WL is embedded in a semiconductor substrate 4. As illustrated in FIG. 4, the word lines WLm and WLm+1 are embedded in the same active region, which is sectioned off by element isolation regions 6 (insulators). When the word lines are activated, channels are formed between the source/drain regions SD. For each word line, one of the source/drain regions SD is connected to a bit line node, and the other region is connected to a capacitor node. In the cross section depicted here, the word line WLm is accessed, and then the corresponding cell transistor Tr is turned off (that is, the channel is broken), which creates floating electrons near the channel that act as carriers. These floating electrons accumulate as the word line WLm is repeatedly accessed and migrate towards the capacitor node of the word line WLm+1, thereby causing a leak at the PN junction that causes the cell capacitor C to lose its charge.

In either case, as the data storage time of the memory cells MC decreases due to one of these mechanisms, the data storage time may fall below the standard refresh cycle. When the data storage time falls below the refresh cycle, some of the data stored in those memory cells MC may be lost even if the refresh operation is performed normally.

To solve this problem, a new feature known as target row refresh is being researched, in which additional refresh operations are performed on memory cells that are in danger of losing data.

The present invention discloses one specific method of implementing this new feature. In essence, to perform a target row refresh, the controller analyzes the row access history of the semiconductor memory device 10, and based on the results of that analysis, the controller sends commands to the semiconductor memory device 10 to perform additional refresh operations. The semiconductor memory device 10 receives these commands and performs the appropriate additional refresh operations. More specifically, the controller analyzes the row access history, and if the access count to a prescribed word line WLm exceeds a prescribed value, the controller issues a target row refresh command TRR and outputs the row address of that word line WLm to the semiconductor memory device 10. This scheme makes it possible for the semiconductor memory device 10 to detect when the data storage properties of the adjacent word lines WLm−1 and WLm+1 have deteriorated due to frequent access to the word line WLm.

However, when the addresses input from the controller are not the addresses of the word lines WLm−1 and WLm+1 that need an additional refresh but rather the address of the word line WLm that originally caused the data storage properties of those other word lines to deteriorate, the semiconductor memory device 10 must convert that address to obtain the addresses of the word lines WLm−1 and WLm+1. Furthermore, the address conversion process must be able to handle cases in which the logical addresses and physical addresses do not match exactly. The TRR address conversion unit 53 of the present embodiment takes these considerations into account when converting addresses input from the controller during additional refresh operations.

Figure 5:
FIG. 5 is a plan view schematically illustrating a configuration in which the logical addresses of the word lines do not match the physical addresses of the word lines.

FIG. 5 is a plan view schematically illustrating a configuration in which the logical addresses of the word lines do not match the physical addresses of the word lines.

In FIG. 5, WL0-WL7 are the physical addresses of the word lines, and the word lines are arranged in order from WL0 to WL7. Meanwhile, the values listed on the right side of the word line WL0-WL7 are the logical addresses of those word lines. The numbers in parentheses are the logical addresses written as decimal numbers. In the example illustrated in FIG. 5, the logical addresses and physical addresses of the word lines do not match. Therefore, the normal address conversion unit 52 depicted in FIG. 2 must convert the addresses appropriately. Furthermore, the fact that the logical addresses and the physical addresses do not match must also be taken into consideration during a target row refresh operation. Consider a case in which the word line WL2 is accessed frequently, and as a result the adjacent word lines WL1 and WL3 require an additional refresh. In this case, the logical addresses of the word lines WL1 and WL3 that need to be refreshed cannot be obtained simply by incrementing and decrementing the logical address 0011 (3) of the word line WL2, which originally caused the disturbance. Therefore, the TRR address conversion unit 53 converts the logical address of the word line WL2 that caused the disturbance to the corresponding physical address. This physical address is then incremented and decremented to calculate the physical addresses of the word lines WL1 and WL3 that need to be refreshed, and the refresh operation is then performed on those word lines.

Here, the address conversion unit 53 may store an address conversion table that indicates the correspondence between the physical addresses and the corresponding logical addresses, as illustrated in FIG. 5. During address conversion, the address conversion unit 53 can reference this address conversion table to look up the logical addresses of the word lines that are physically adjacent to the word line that caused the disturbance.

Figure 6:
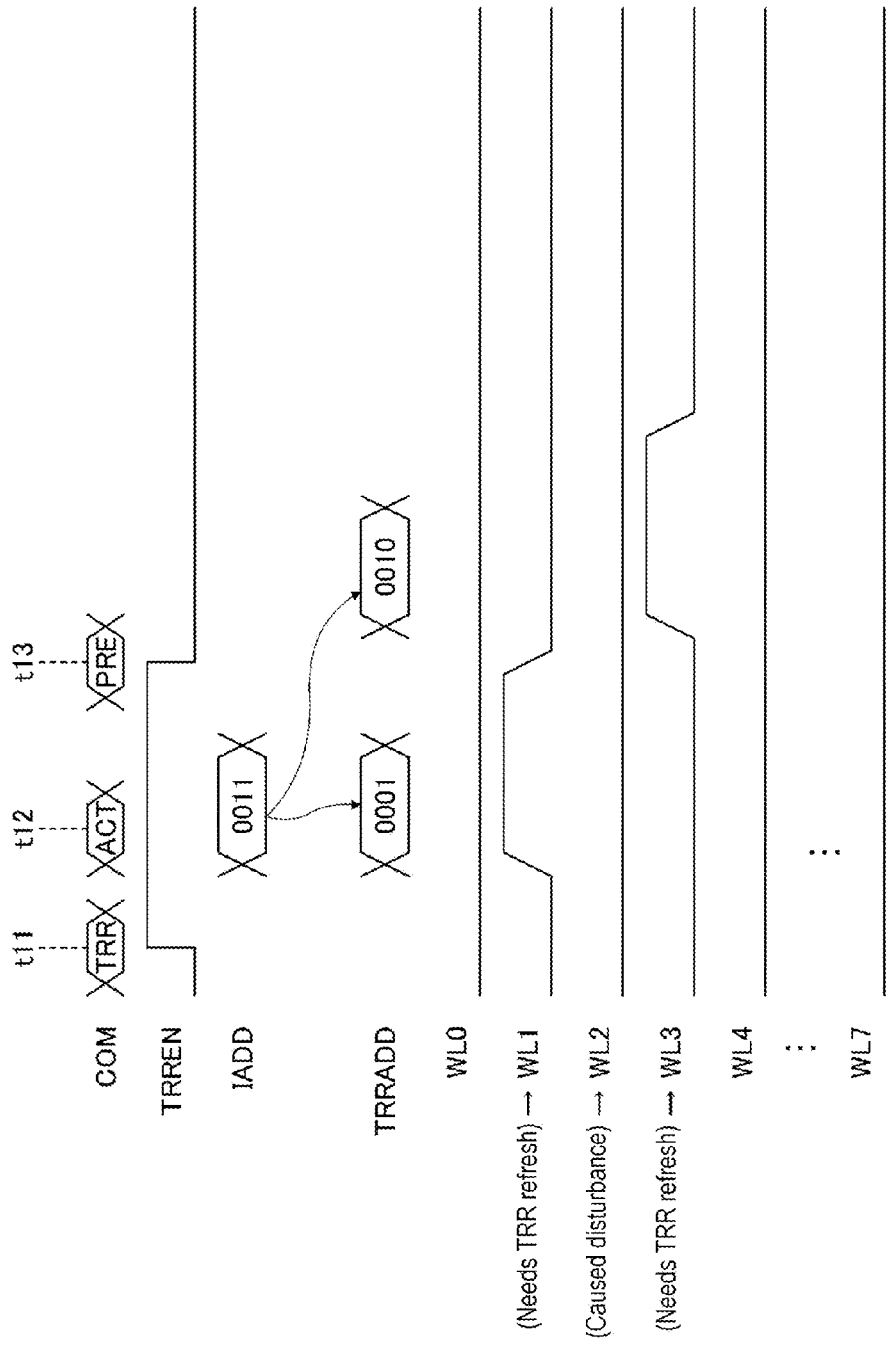
FIG. 6 is a first timing diagram illustrating the operation of the semiconductor memory device 10.

FIG. 6 is a first timing diagram illustrating the operation of the semiconductor memory device 10 according to the present embodiment. FIG. 6 depicts a case in which during a target row refresh operation, the controller only supplies the address of the word line that caused a disturbance.

The target row refresh command TRR is input from the controller to the semiconductor device 10 at time t11. This generates an MRS command that enables the target row refresh state. Once the target row refresh command TRR is issued, the main control circuit 34 illustrated in FIG. 2 switches the target row refresh enable signal TRREN from the low level to the high level. Then, the address input to the selection circuit 51 is input to the TRR address conversion unit 53 for conversion. The TRR address conversion unit 53 then outputs the converted address to the row decoder 12.

Next, at time t12, an active command ACT and the logical address 0011 of the word line WL2 that caused the disturbance are input. This address is converted by the TRR address conversion unit 53 to obtain the physical addresses of the adjacent word lines WL1 and WL3. As illustrated in FIG. 6, the logical addresses of the word lines WL1 and WL3 are 0001 and 0010, respectively.

The physical addresses TRRADD of the word lines WL1 and WL3 obtained from the TRR address conversion unit 53 are then sent to the row decoder 12 one at a time. The word lines WL1 and WL3 are then refreshed to restore the electric charges in the memory cells MC that had deteriorated due to the disturbance.

Next, at time t13, a pre-charge command PRE is issued, and the main control circuit 34 returns the target row refresh enable signal TRREN to the low level. The device then returns to the normal operation mode.

Figure 7:
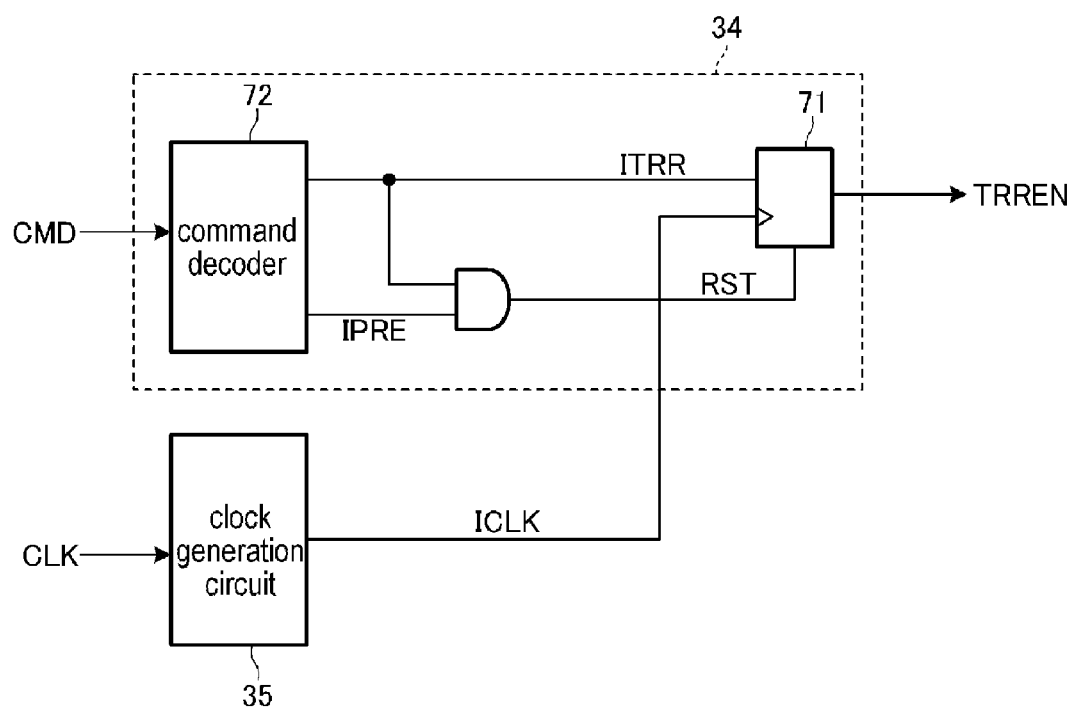
FIG. 7 is a circuit diagram of a main control circuit 34 for achieving the behavior illustrated in FIG. 6.

FIG. 7 illustrates the internal configuration of the main control circuit 34. As illustrated in FIG. 7, the main control circuit 34 may include a latch circuit 71 for returning the device to the normal operation mode when the pre-charge command PRE is issued. A command decoder 72 receives the target row refresh command TRR and generates a target row refresh signal ITRR or receives a pre-charge command PRE and generates a pre-charge signal IPRE. The target row refresh signal ITRR sets the latch circuit 71, and the latch circuit 71 is reset by a logical AND signal RST calculated from the target row refresh signal ITRR and the pre-charge signal IPRE. The latch circuit 71 outputs a target row refresh enable signal TRREN. In this configuration, after the target row refresh enable signal TRREN is issued, the pre-charge command PRE only has to be issued once to return the device to the normal operation mode. This configuration also makes it possible to deactivate the target row refresh enable signal TRREN (like at time t13 in FIG. 6).

Figure 8:
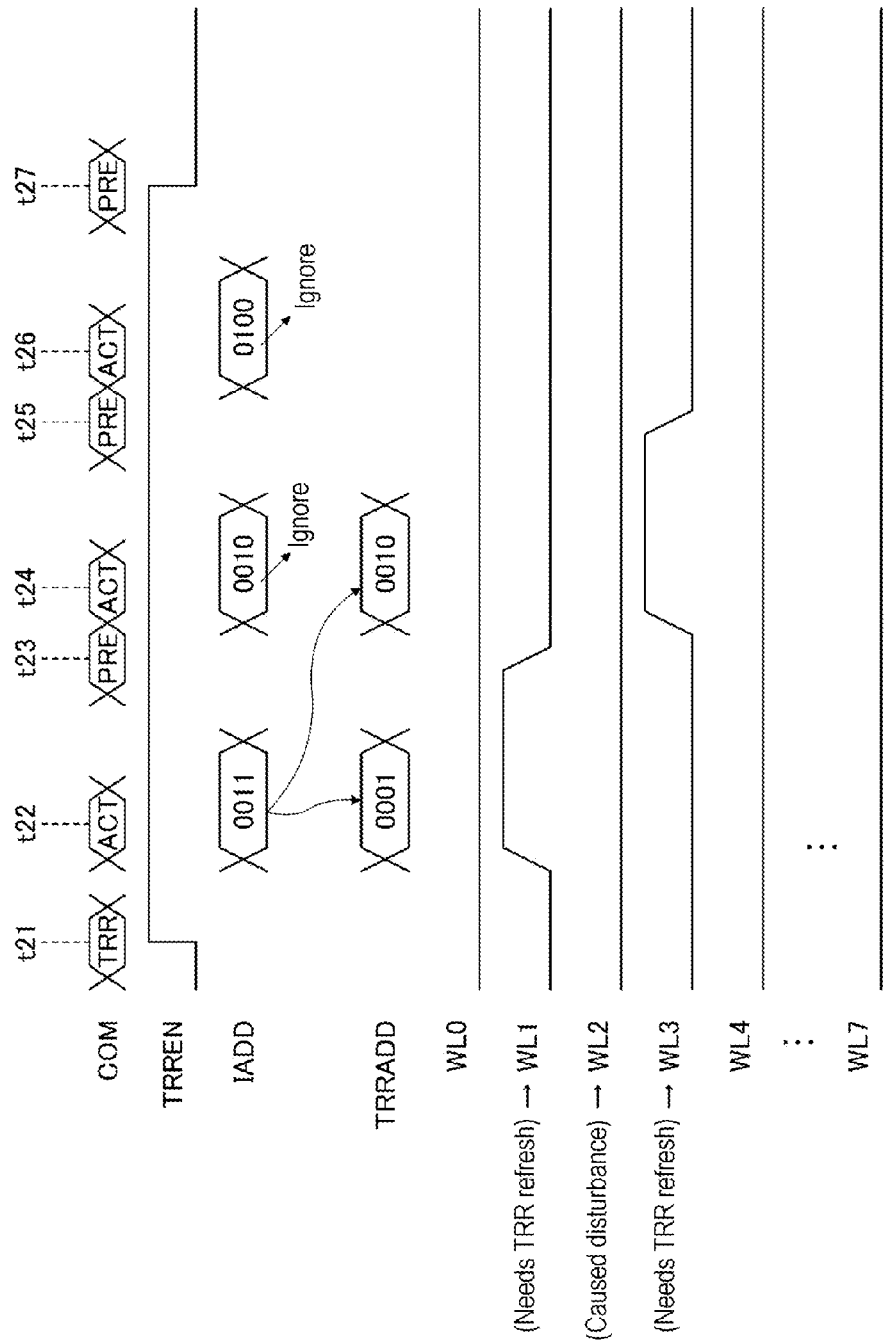
FIG. 8 is a second timing diagram illustrating the operation of the semiconductor memory device 10.

FIG. 8 is a second timing diagram illustrating the operation of the semiconductor memory device 10 according to the present embodiment. FIG. 8 depicts a case in which during a target row refresh operation, the controller supplies the address of the word line that caused a disturbance as well as the addresses of word lines that need an additional refresh.

In the example illustrated in FIG. 8, the target row refresh command TRR is input from the controller to the semiconductor device 10 at time t21. This generates an MRS command that enables the target row refresh state. Then, the target row refresh enable signal TRREN is switched from the low level to the high level.

Next, at time t22, an active command ACT and the logical address 0011 of the word line WL2 that caused the disturbance are input. This address is converted by the TRR address conversion unit 53 to obtain the physical addresses TRRADD of the adjacent word lines WL1 and WL3. In this way, the word lines WL1 and WL3 are refreshed similarly to the case described in reference to FIG. 6.

Next, at time t23, the pre-charge command PRE is issued again.

Then, at time t24, an active command ACT is input together with an address of 0010 calculated by decrementing the logical address 0011 of the word line WL2 that caused the disturbance.

Next, at time t25, the pre-charge command PRE is issued again.

Then, at time t26, an active command ACT is input together with an address of 0100 calculated by incrementing the logical address 0011 of the word line WL2 that caused the disturbance.

Next, at time t27, the pre-charge command PRE is issued again.

As described above, the logical addresses calculated by incrementing and decrementing the logical address of the word line WL that caused the disturbance (that is, the addresses input at times t24 and t26) do not correspond to the word lines WL that were actually affected by the disturbance. Therefore, the TRR address conversion unit 53 ignores the addresses input at times t24 and t26, and these addresses are not accessed.

Moreover, in the example illustrated in FIG. 8, the target row refresh enable signal TRREN is switched back to the low level after the third pre-charge command PRE is issued at time t27.

Figure 9:
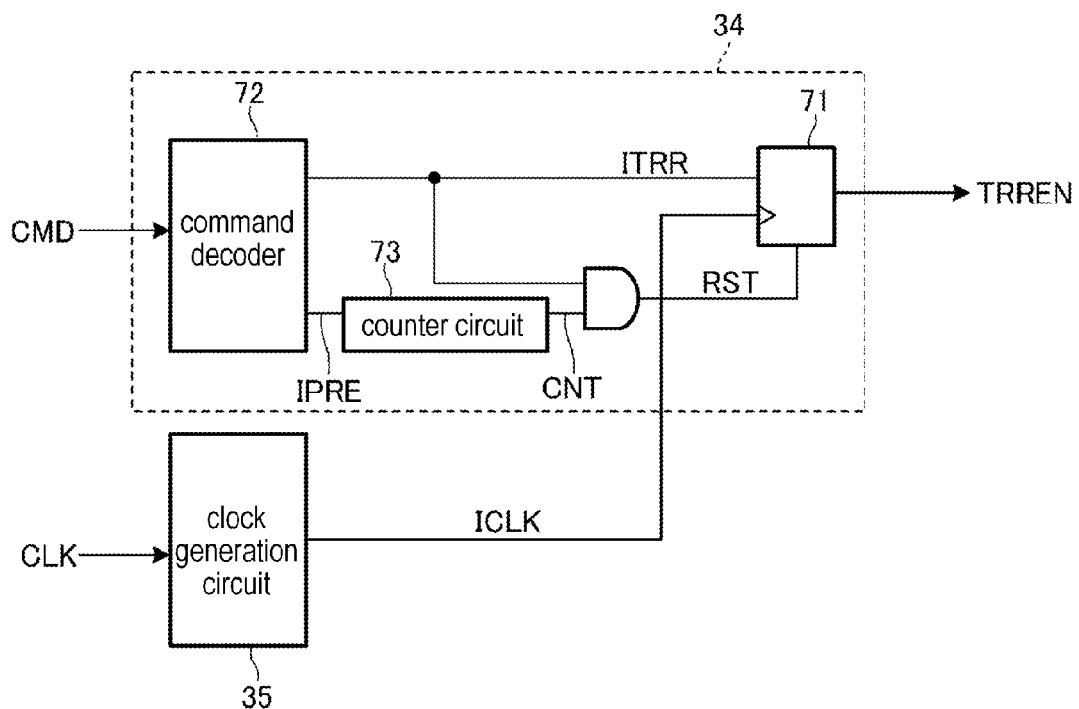
FIG. 9 is a circuit diagram of a main control circuit 34 for achieving the behavior illustrated in FIG. 8.

As illustrated in FIG. 9, the main control circuit 34 may include both a latch circuit 71 and a counter circuit 73 for returning the device to the normal operation mode after a certain number of pre-charge commands PRE (three, for example) are issued. Once the counter circuit 73 counts the prescribed number of pre-charge signals IPRE (three, for example), the counter circuit 73 switches the output signal CNT to the high level. In this configuration, after the target row refresh enable signal TRREN is issued, the device returns to the normal operation mode once the pre-charge command PRE is issued several times.

Figure 10:
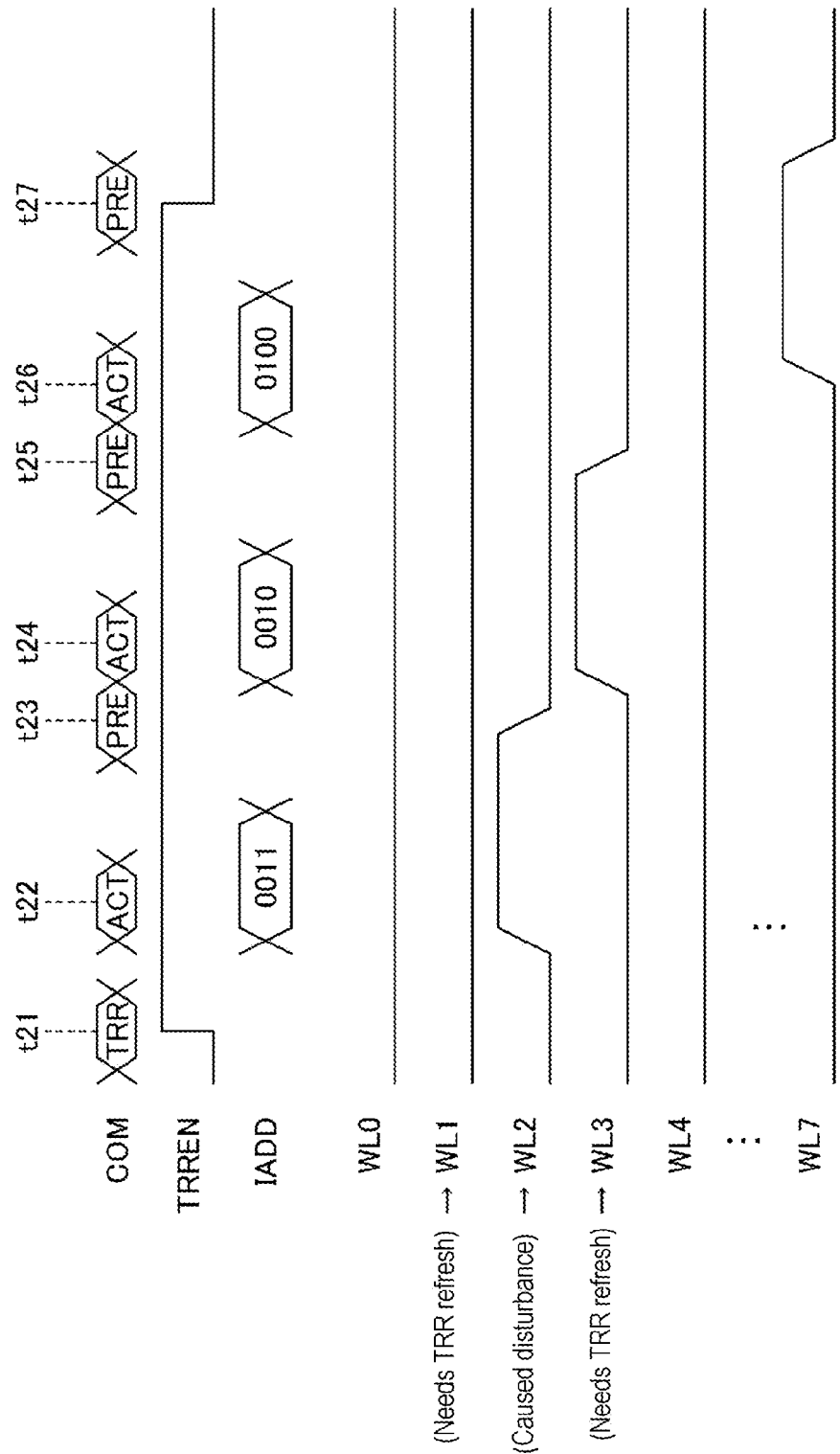
FIG. 10 is a timing diagram illustrating the operation of a semiconductor memory device according to a comparative example that does not include a TRR address conversion unit 53.

FIG. 10 is a timing diagram illustrating the operation of a semiconductor memory device according to a comparative example that does not include a TRR address conversion unit 53. The same reference characters are used for times that are the same as in FIG. 8.

As illustrated in FIG. 10, in the semiconductor memory device that does not include a TRR address conversion unit 53, the addresses input from the controller are refreshed as-is during a target row refresh operation. In other words, the logical addresses 0011, 0010, and 0100 are refreshed at times t22, t24, and t26, respectively. In this case, the word lines that actually get refreshed are the word lines WL2, WL3, and WL7. One of the word lines WL1 that needs an additional refresh is not accessed. Conversely, the word lines WL2 and WL7 that did not need an additional refresh are erroneously accessed.

Therefore, a semiconductor memory device that does not include the TRR address conversion unit 53 cannot properly perform the target row refresh operation when the logical addresses and physical addresses do not match exactly. In contrast, the semiconductor memory device 10 according to the present embodiment uses the TRR address conversion unit 53 to convert addresses. In this configuration, the controller just has to input the address of the word line that caused the disturbance to properly perform an additional refresh on the adjacent word lines WL1 and WL3.

Next, Embodiment 2 of the present invention will be described.

Figure 11:
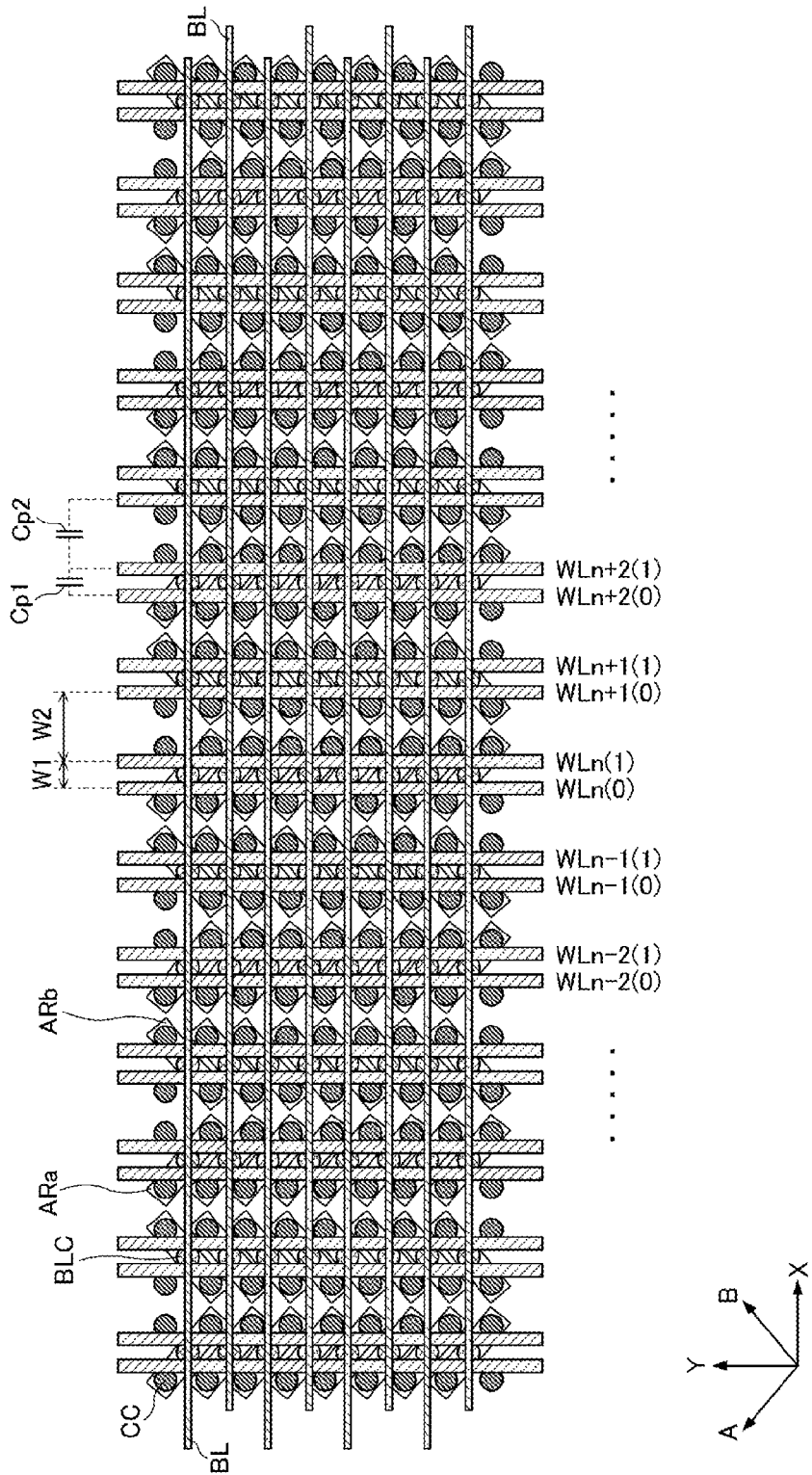
FIG. 11 is a plan view schematically illustrating a configuration of a memory cell array 11 according to Embodiment 2 of the present invention.

FIG. 11 is a plan view schematically illustrating a configuration of a memory cell array 11 according to Embodiment 2 of the present invention.

As illustrated in FIG. 11, in the present embodiment word lines WL corresponding to pairs of cell transistors Tr that each share a bit line contact BLC (such as the word lines WLn(0) and WLn(1)) are arranged close to one another with a width W1 therebetween. The bit line contacts BLC are conductive contacts for connecting either the source or drain electrode of each cell transistor Tr to a respective bit line BL. The other source/drain electrode of each cell transistor Tr is connected via a cell contact CC to a cell capacitor C (not illustrated in the figure).

Meanwhile, adjacent word lines WL corresponding to cell transistors Tr that do not share bit line contacts BLC (such as the word lines WLn(1) and WLn+1(0)) are arranged with a width W2 therebetween, where W2>W1. As illustrated in FIG. 11, this layout includes active regions ARa with a lengthwise direction parallel to the A direction and active regions ARb with a lengthwise direction parallel to the B direction. The active regions ARa and ARb are formed alternately in the X direction.

Recall the first theory described above. When the memory cell array 11 is laid out in this manner and a certain word line WLn(0) is accessed repeatedly, the adjacent word line WLn(1) that is only separated by the width W1 will experience a disturbance due to the large associated parasitic capacitance Cp1. However, the adjacent word line WLn−1(1) that is separated by the width W2 will experience almost no disturbance due to the much smaller associated parasitic capacitance Cp2. Therefore, in this layout the word line WLn(1) that does experience a disturbance does require an additional refresh, but the other word line WLn−1(1) does not require an additional refresh.

Recall also the second theory described above. Although no element isolation region is provided between each pair of word lines (WLn(0) and WLn(1), for example), an element isolation region is provided between unpaired word lines (WLn(1) and WLn+1(0), for example). Therefore, when the word line WLn(0) is repeatedly accessed, the word line on the side that does not prevent accumulation of floating electrons (that is, the word line WLn(1) that experiences a disturbance) does require an additional refresh. However, the word line on the side that does prevent accumulation of floating electrons (that is, the word line WLn−1(1)) does not require an additional refresh.

Moreover, the logical addresses and physical addresses of the word lines WLn(0) and WLn(1) that are separated by the width W1 differ only by the lowest bit (A0) of the assigned row address, and the other bits (A1 to A14) are all the same. This makes it possible to drastically simplify the circuit configuration of the TRR address conversion unit 53.

Figure 12:
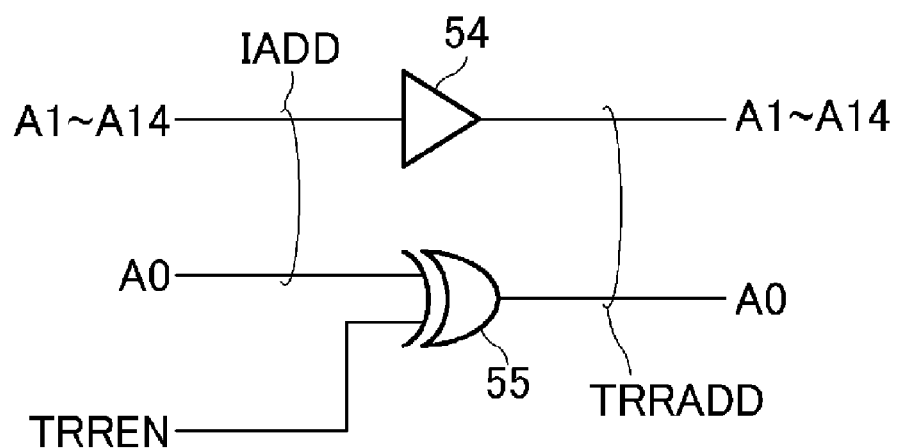
FIG. 12 is a circuit diagram of a TRR address conversion unit 53 used in Embodiment 2.

FIG. 12 is a circuit diagram of a TRR address conversion unit 53 used in the present embodiment.

The TRR address conversion unit 53 illustrated in FIG. 12 includes a buffer circuit 54 that buffers the upper bits A1 to A14 of address signals and an exclusive OR circuit 55 that receives the lowest bit A0 of address signals and the target row refresh enable signal TRREN. In this configuration, when the target row refresh enable signal TRREN is switched to the high level, the lowest bit A0 of the input address signal IADD gets flipped by the exclusive OR circuit 55.

Figure 13:
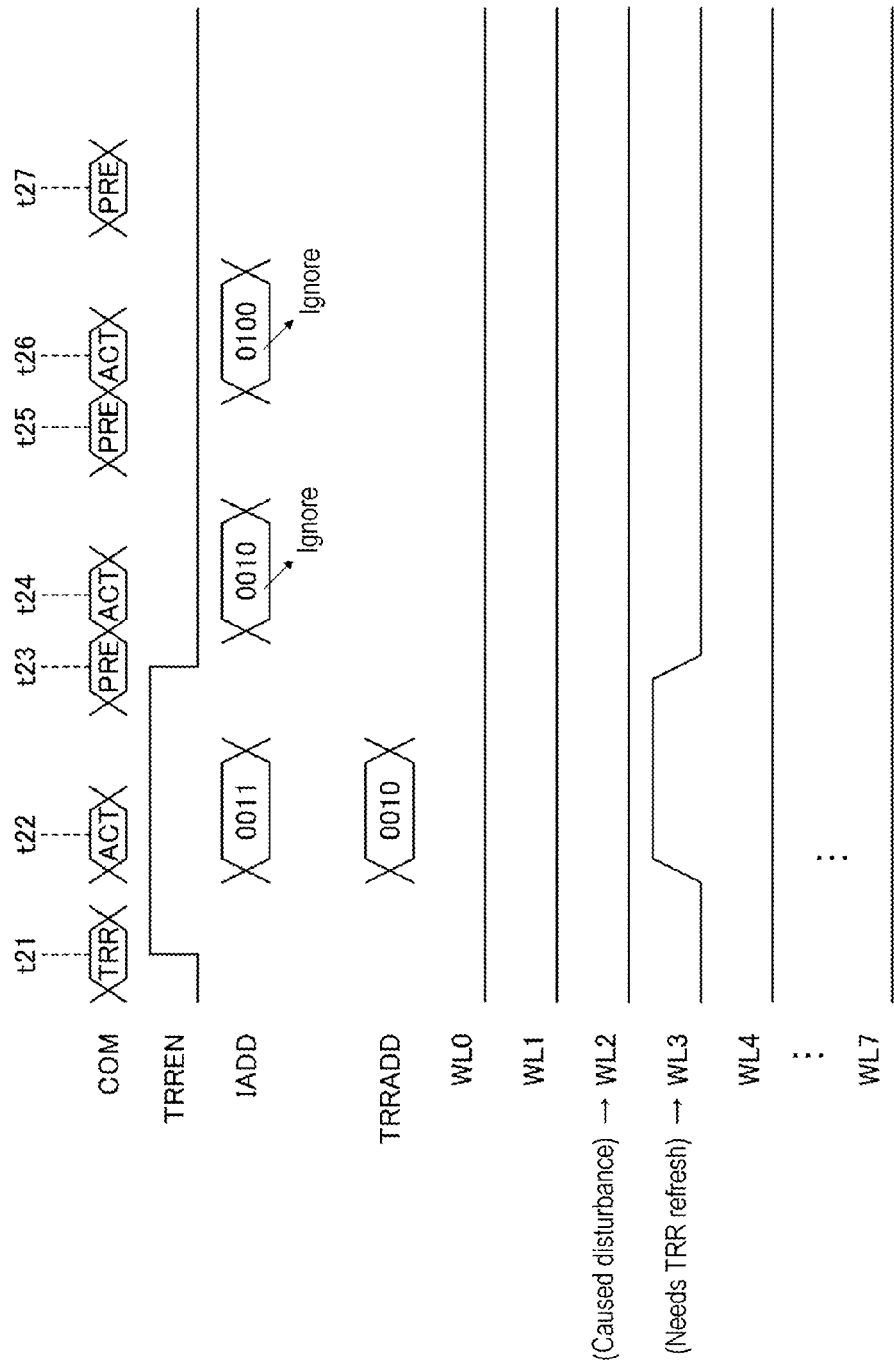
FIG. 13 is a timing diagram illustrating the operation of a semiconductor memory device 10 according to Embodiment 2.

FIG. 13 is a timing diagram illustrating the operation of the semiconductor memory device 10 according to the present embodiment. The same reference characters are used for times that are the same as in FIG. 8.

At time t22, the logical address 0011 of word line WL2 is input to the TRR address conversion unit 53 and converted to a logical address of 0010. In this way, an additional refresh is performed on the word line WL3, which had experienced a disturbance.

Next, at time t23, the target row refresh enable signal TRREN is switched back to the low level after the first pre-charge command PRE is issued.

The TRR address conversion unit 53 ignores the address signals ADD input at times t24 and t26, and these addresses are not accessed. Moreover, in this example the target row refresh enable signal TRREN is switched back to the low level after the first pre-charge command PRE is issued at time t23, but the target row refresh enable signal TRREN may instead be switched back to the low level after the third pre-charge command PRE is issued at time t27.

In the present embodiment, the normal address conversion unit 52 and the TRR address conversion unit 53 convert logical addresses to physical addresses when such conversion is necessary.

In this way, when the memory cell array 11 is configured as illustrated in FIG. 11, additional refresh operations are performed on the word lines WL that experience a disturbance by flipping the lowest bit A0 of the input address signals.

Next, Embodiment 3 of the present invention will be described.

Figure 14:
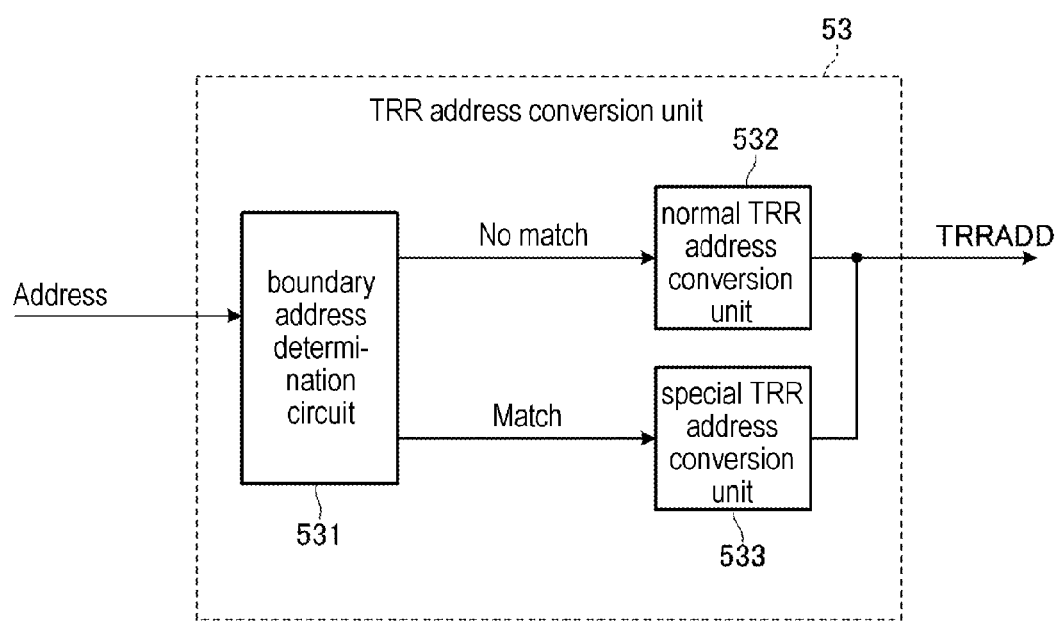
FIG. 14 is a block diagram of a TRR address conversion unit 53 used in Embodiment 3.
Figure 15:
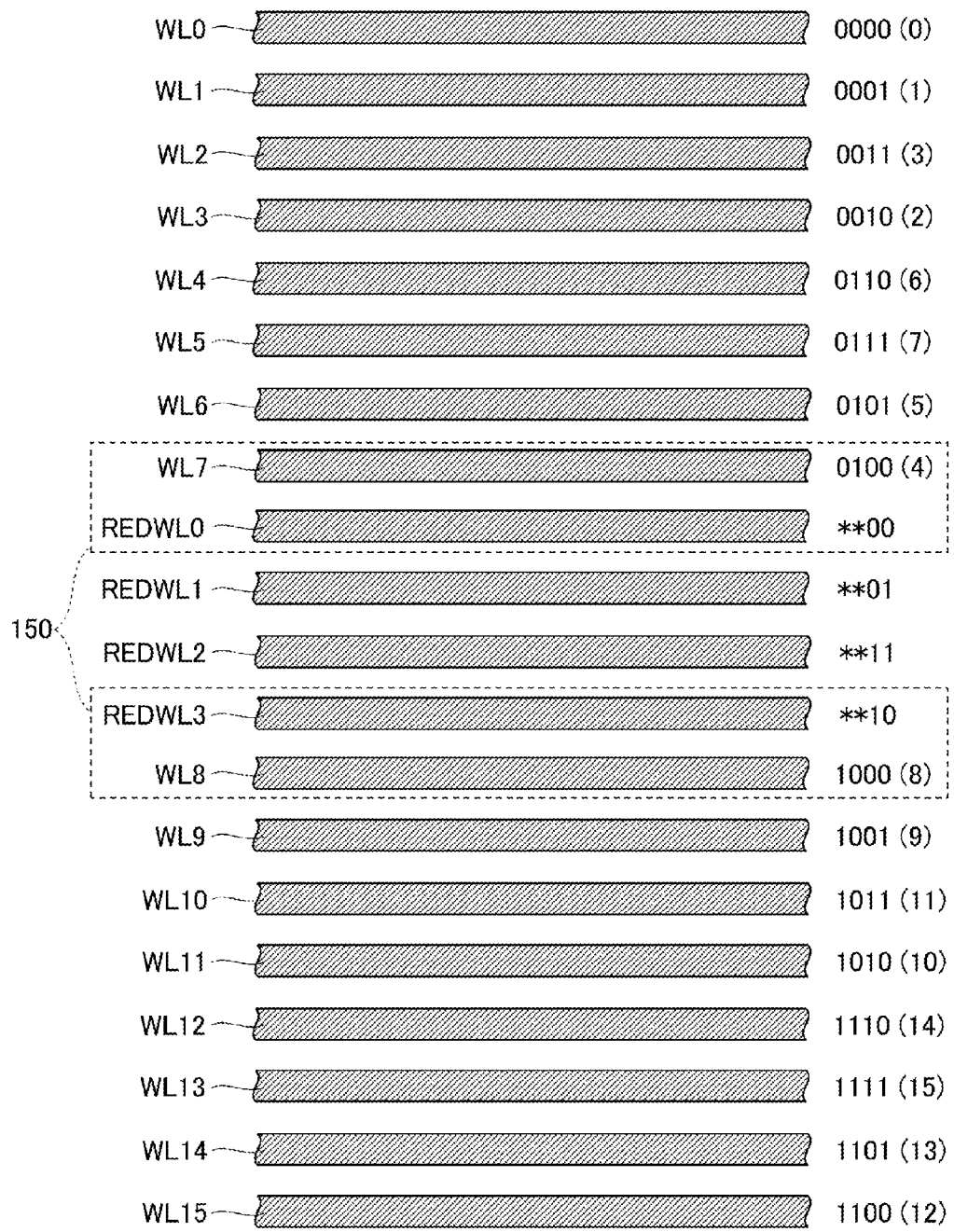
FIG. 15 is a plan view schematically illustrating a configuration in which the logical addresses and physical addresses of word lines and redundant word lines in Embodiment 3 do not match.

FIG. 14 is a block diagram of a TRR address conversion unit 53 used in Embodiment 3. Word lines that are positioned on boundaries 150 as illustrated in FIG. 15 require a special conversion process to obtain the logical addresses of the corresponding redundant word lines. This is because different logical address assignment conventions are used in the normal areas (from WL0 to WL7 and from WL8 to WL15 in FIG. 15) and the redundant area (from REDWL0 to REDWL3 in FIG. 15).

As illustrated in FIG. 15, here the word lines that are positioned on the boundaries 150 are WL7, REDWL0, REDWL3, and WL8. The word lines that are not positioned on the boundaries 150 in FIG. 15 are WL0 to WL6, REDWL1, REDWL2, and WL9 to WL15.

The TRR address conversion unit 53 includes a boundary address determination circuit 531, a normal TRR address conversion unit 532, and a special TRR address conversion unit 533. The boundary address determination circuit 531 determines whether an input address corresponds to a word line positioned on the abovementioned boundaries. If a match is not found (the word line is not on a boundary), the input address is sent to the normal TRR address conversion unit 532 for conversion. If a match is found (the word line is on a boundary), the input address is sent to the special TRR address conversion unit 533 for conversion. The resulting TRRADD signal is then output from either the normal TRR address conversion unit 532 or the special TRR address conversion unit 533. The boundary address determination circuit 531 may store the addresses of word lines positioned on the boundaries 150 and use that information to make the determination.

FIG. 15 is a plan view schematically illustrating a configuration in which the logical addresses and physical addresses of word lines and redundant word lines in Embodiment 3 do not necessarily match. Word lines WL0 to WL7 are the same as in FIG. 5. In this case, when word lines on either side of a word line that caused a disturbance both require a TRR refresh as in Embodiment 1, the special TRR address conversion unit must be used. On the other hand, when only one of the word lines adjacent to a word line that caused a disturbance requires a TRR refresh as in Embodiment 2, only conversion of the X0 address is required. This is because an element isolation region is formed between WL7 and REDWL0 and between REDWL3 and WL8, and therefore according to the second theory described above, a disturbance will not reach from the normal areas across to the redundant area. Next, cases in which the word lines on either side of a word line that caused a disturbance both require a TRR refresh will be described.

A) The addresses of word lines positioned on the boundaries must be converted using the special address conversion unit 533. When the logical address 0100 of WL7 is input to the special address conversion unit 533, for example, the special address conversion unit 533 returns the logical address 0101 of WL6 as well as the address 00 of REDWL0. In this case, the logical addresses 0101 and 00 are included in the TRRADD signal.

When the logical address 00 of REDWL0 is input to the special address conversion unit 533, for example, the special address conversion unit 533 returns the logical address 0100 of WL7 as well as the address 11 of REDWL1. In this case, the logical addresses 0100 and **11 are included in the TRRADD signal.

Here, the ** portion of the address indicates that this address is located in the redundant area (from REDWL0 to REDWL3). The conversion process must also be able to handle these addresses in the redundant area for word lines that are positioned on the boundaries. This entails converting between normal logical addresses and addresses in the redundant area, which requires a more advanced conversion process. Therefore, a special conversion process and an additional circuit for performing that special conversion process are required in addition to the normal address conversion process and circuit described in Embodiment 1.

B) The addresses of word lines that are positioned on the boundaries do not need to be converted using the special address conversion unit 533. When the logical address 0101 of WL6 is input to the normal TRR address conversion unit 532, for example, the normal TRR address conversion unit 532 returns the logical address 0111 of WL5 as well as the logical address 0100 of WL7. In this case, the conversion process does not need to be able to handle addresses in the redundant area (addresses that include **). The same conversion process described in Embodiment 1 may therefore be applied here as well. In this case, the logical addresses 0111 and 0100 are included in the TRRADD signal.

In consideration of the two abovementioned cases, it is preferable that a boundary address determination circuit 531 be provided and that the appropriate address conversion processes be performed according to the result of that determination, as is done here in Embodiment 3. The normal TRR address conversion unit 532 and the special TRR address conversion unit 533 may each store a different address conversion table and reference the respective address conversion tables to look up the desired addresses.

Figure 16:
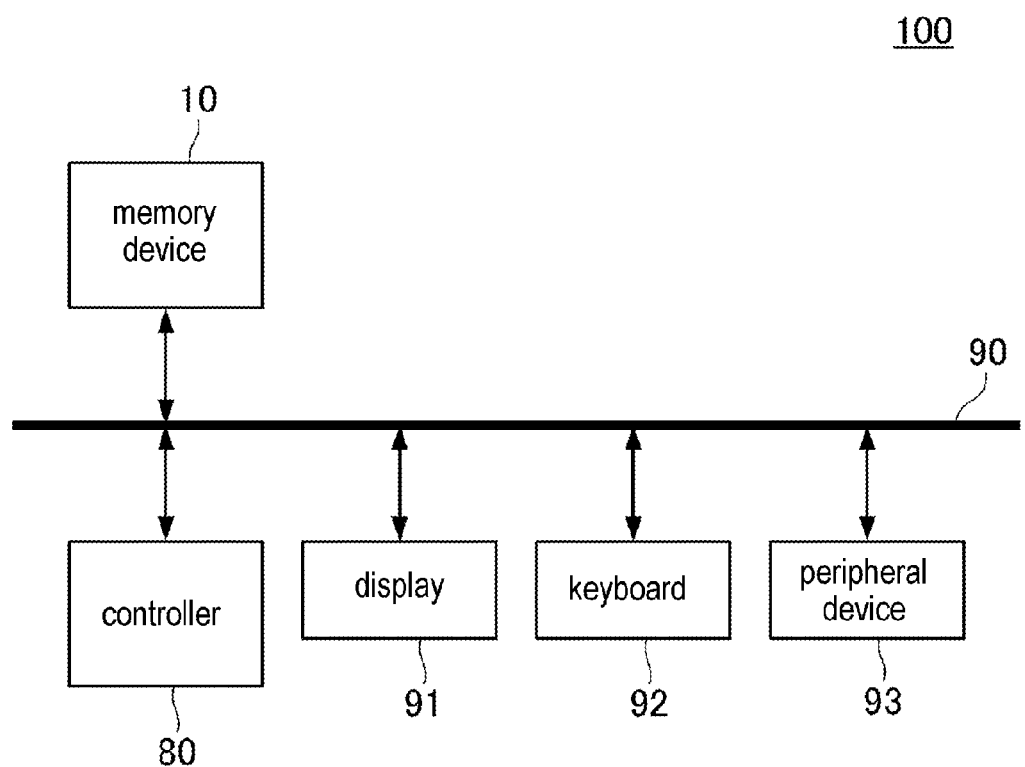
FIG. 16 is a block diagram illustrating a system that includes a semiconductor memory device 10.

FIG. 16 is a block diagram illustrating a system that includes a semiconductor memory device 10.

In the system illustrated in FIG. 16, the semiconductor memory device 10 (a memory device) is connected to a controller 80 via a bus 90. Output devices such as a display 91, input devices such as a keyboard 92, and other peripheral devices 93 are also connected to the bus 90. Examples of peripheral devices 93 include interface devices such as network devices and high capacity storage devices such as hard disk drives.

Figure 17:
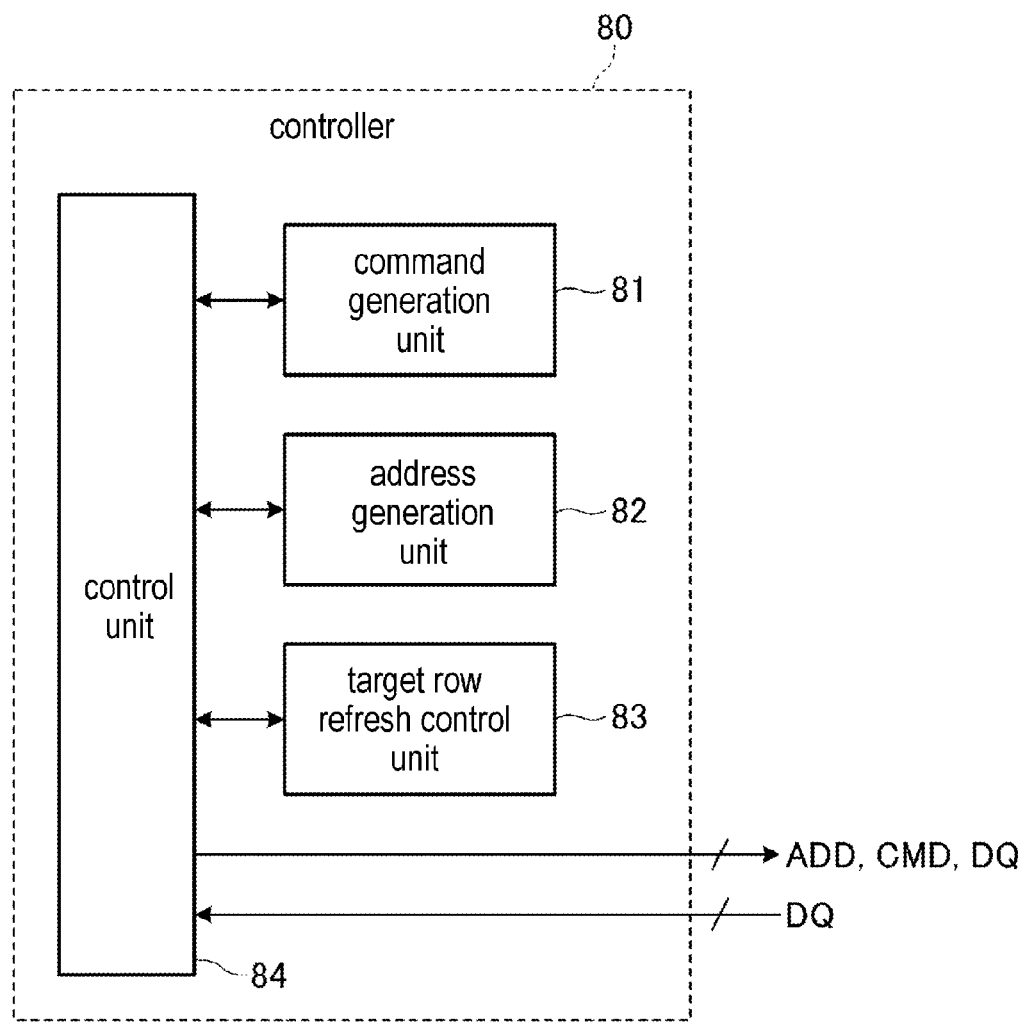
FIG. 17 is a block diagram illustrating a configuration of a controller 80.

As illustrated in FIG. 17, the controller 80 includes a command generation unit 81, an address generation unit 82, and a target row refresh control unit 83. The command generation unit 81 generates command signals CMD to be sent to the semiconductor memory device 10. The generated command signals CMD are output from a control unit 84. The address generation unit 82 generates address signals ADD to be sent to the semiconductor memory device 10. The generated address signals ADD are also output from the control unit 84. The target row refresh control unit 83 is a circuit that analyzes the access history of the semiconductor memory device 10. Furthermore, the control unit 84 also handles receiving read data DQ read from the semiconductor memory device 10 as well as sending write data DQ to be written to the semiconductor memory device 10.

Figure 18:
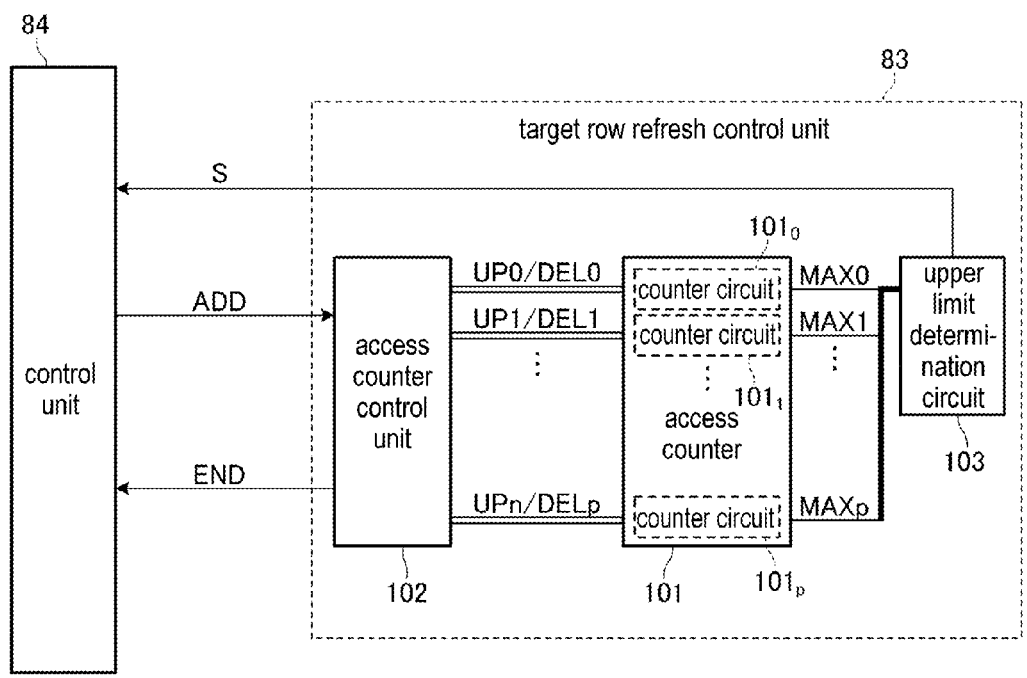
FIG. 18 is a block diagram illustrating a configuration of a target row refresh control unit 83 according to a first example.

FIG. 18 is a block diagram illustrating a configuration of the target row refresh control unit 83 according to a first example.

The target row refresh control unit 83 is a circuit that analyzes the row access history of the memory cell array 11. As illustrated in FIG. 18, the target row refresh control unit 83 includes an access counter 101, an access counter control unit 102, and an upper limit determination circuit 103. The access counter 101 includes counter circuits $101_0$ to $101_p$ for each of the word lines WL0 to WLp. The access counter control unit 102 increments the count stored in each counter circuit $101_0$ to $101_p$ and can also reset these counts. The counter circuits $101_0$ to $101_p$ are binary counters that each include a plurality of flip-flop circuits.

The access counter control unit 102 receives row address signals ADD from the control unit 84 and increments the counter circuits $101_0$ to $101_p$ corresponding to the specified word lines WL. For example, when an active command ACT and an address signal ADD that specifies word line WL0 are output to the semiconductor memory device 10, an increment signal UP0 is issued to increment the counter circuit $101_0$ corresponding to the word line WL0.

In this way, the access counter 101 stores the row access history of the semiconductor memory device 10. Furthermore, when the counts stored in the counter circuits $101_0$ to $101_p$ reach a prescribed value, detection signals MAX0 to MAXp are issued. The detection signals MAX0 to MAXp are then sent to the upper limit determination circuit 103.

If the upper limit determination circuit 103 determines that one of the detection signals MAX0 to MAXp has been issued, the upper limit determination circuit 103 outputs a determination signal S. Once a determination signal S is issued, the command generation unit 81 illustrated in FIG. 17 generates a target row refresh command TRR that is then sent to the semiconductor memory device 10 via the control unit 84. Then, as described above in reference to FIG. 6, an active command ACT is issued and input together with an address signal ADD to the semiconductor memory device 10. This scheme makes it possible for the semiconductor memory device 10 to perform the target row refresh operation as described above.

Moreover, once a target row refresh command TRR is issued, the control unit 84 sends an end signal END to the access counter control unit 102. The access counter control unit 102 uses this signal to reset the count of the corresponding counter circuit $101_0$ to $101_p$. For example, if a detection signal MAX0 and the corresponding target row refresh command TRR are issued, the access counter control unit 102 issues a delete signal DEL0 to reset the count of the counter circuit $101_0$ corresponding to word line WL0.

This circuit configuration makes it possible for the controller 80 to store and analyze the access history of the semiconductor memory device 10. Moreover, the target row refresh control unit 83 illustrated in FIG. 18 uses binary counters to count accesses, thereby making it possible to easily analyze the access history.

Figure 19:
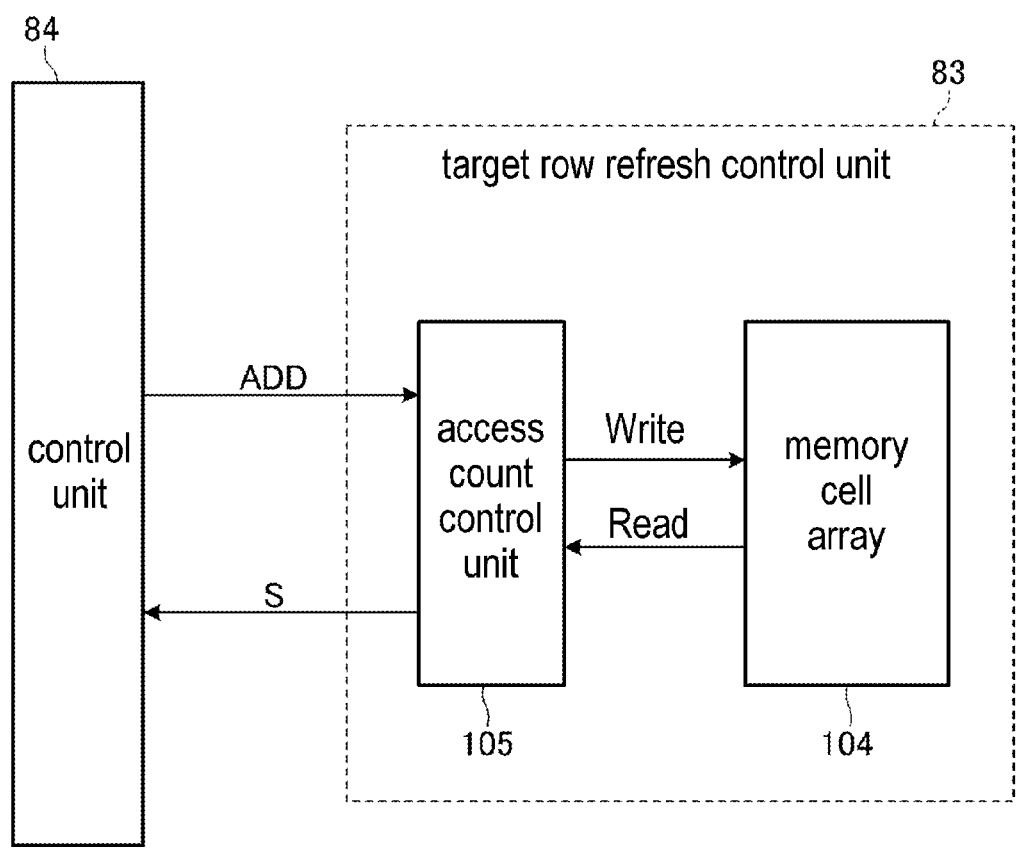
FIG. 19 is a block diagram illustrating a configuration of a target row refresh control unit 83 according to a second example.

FIG. 19 is a block diagram illustrating a configuration of the target row refresh control unit 83 according to a second example.

The target row refresh control unit 83 illustrated in FIG. 19 uses a memory cell array 104 instead of the access counter 101. An access count control unit 105 reads and writes data to and from the memory cell array 104. The memory cell array 104 includes a plurality of DRAM cells and SRAM cells arranged in a matrix. Data written to the addresses within this matrix represent access counts to the corresponding word lines WL in the semiconductor memory device 10.

In other words, when an active command ACT is issued to access a row address in the semiconductor memory device 10, the data corresponding to that row address is read from the memory cell array 104, incremented, and written back to the memory cell array 104. As this process is repeated, the memory cell array 104 stores the access history of the semiconductor memory device 10.

When the data read from the memory cell array 104 is incremented and the result is equal to a prescribed value, the access count control unit 105 issues a determination signal S. Once this determination signal S is issued, a target row refresh command TRR is generated. In this way, the semiconductor memory device 10 performs the target row refresh operation as described above. Moreover, when the access count control unit 105 issues the determination signal S, the corresponding data (that is, the access count) is reset and written back to the memory cell array 104.

This circuit configuration also makes it possible for the controller 80 to store and analyze the access history of the semiconductor memory device 10. Moreover, the target row refresh control unit 83 illustrated in FIG. 19 uses the memory cell array 104 to count accesses, thereby making it possible to reduce the space occupied by the counter circuit on the chip.

Furthermore, the memory cell array 104 does not have to be built into the controller 80 and may be connected to the bus 90 as a separate memory device.

Various embodiments of the present invention were described above. However, the present invention is not limited to these embodiments. Various modifications can be made without departing from the spirit of the present invention, and such modifications are included within the scope of the present invention.

DESCRIPTION OF REFERENCE CHARACTERS 4 semiconductor substrate
6 element isolation region
10 semiconductor memory device
11 memory cell array
12 row decoder
13 column decoder
14 mode register
15 FIFO circuit
16 input/output circuit
21 address terminal
22 command terminal
23 clock terminal
24 data terminal 25, 26 power supply terminal
31 address input circuit
32 command control circuit
33 command input circuit
34 main control circuit
35 clock generation circuit
36 refresh control circuit
37 address generation circuit
38 internal power supply generation circuit
40 row control circuit
41, 43 selection circuit
42 address register circuit
44 redundancy determination circuit
50 target row refresh circuit
51 selection circuit
52 normal address conversion unit
53 TRR address conversion unit
54 buffer circuit
55 exclusive OR circuit
61 pre-decoder circuit
62 decoder circuit
71 latch circuit
72 command decoder
73 counter circuit
80 controller
81 command generation unit
82 address generation unit
83 target row refresh control unit
84 control unit
90 bus
91 display
92 keyboard
93 peripheral device
101 access counter
102 access counter control unit
103 upper limit determination circuit
104 memory cell array
105 access count control unit
$101_0$ to $101_p$ counter circuit
150 boundary
531 boundary address determination circuit
532 normal TRR address conversion unit
533 special TRR address conversion unit
ARa, ARb active region
BL bit line
BLC bit line contact
C cell capacitor
CC cell contact
MC memory cell
SA sense amplifier
SD source/drain
Tr cell transistor
WL word line
REDWL redundant word line

What is claimed is:

1. A semiconductor memory device, comprising:
a memory array having a plurality of word lines;
a row decoder circuit that receives a first address and specifies a corresponding first word line of the plurality of word lines, receives a second address and specifies a corresponding second word line of the plurality of word lines, and receives a third address and specifies a corresponding third word line of the plurality of word lines; and
a first circuit that receives address information that includes the first address and the second address;
wherein, when a target row refresh signal has not been issued, the first circuit receives the first address and outputs that first address to the row decoder circuit and then receives the second address and outputs that second address to the row decoder circuit, and, when a target row refresh signal has been issued, the first circuit receives the first address and outputs the third address to the row decoder circuit.

2. The semiconductor memory device as claimed in claim 1, wherein the second word line specified by the second address is not adjacent to the first word line specified by the first address, and the third word line specified by the third address is adjacent to the first word line specified by the first address.

3. The semiconductor memory device as claimed in claim 2, wherein:
the row decoder circuit also receives a fourth address and specifies a corresponding fourth word line of the plurality of word lines;
the fourth word line specified by the fourth address is adjacent to the first word line specified by the first address and is disposed on an opposite side of the first word line than the third word line; and
when a target row refresh signal has been issued, the first circuit receives the first address and outputs the fourth address to the row decoder circuit.

4. The semiconductor memory device as claimed in claim 1, further comprising:
a control circuit that receives the target row refresh signal, and wherein, after the target row refresh signal has been issued, the control circuit receives a first input pre-charge signal and returns the target row refresh signal to a non-issued state.

5. The semiconductor memory device as claimed in claim 1, further comprising:
a control circuit that receives the target row refresh signal, and wherein, after the target row refresh signal has been issued, the control circuit counts pre-charge signals input thereto and returns the target row refresh signal to a non-issued state when the count reaches a first value.

6. The semiconductor memory device as claimed in claim 1, wherein:
the plurality of word lines of the memory array are arranged running in a first direction;
the memory array further includes a plurality of redundant word lines arranged adjacently and running parallel to the plurality of word lines arranged running in the first direction; and
the first circuit further includes a boundary determination circuit that determines whether the first address specifies a word line directly adjacent to one of the redundant word lines and whether the first address specifies a redundant word line directly adjacent to one of the word lines.

7. A system, comprising:
a semiconductor memory device comprising:
a memory array having a plurality of word lines;
a row decoder circuit that receives a first address and specifies a corresponding first word line of the plurality of word lines, receives a second address and specifies a corresponding second word line of the plurality of word lines, and receives a third address and specifies a corresponding third word line of the plurality of word lines; and
a first circuit that receives address information that includes the first address and the second address;

wherein, when a target row refresh signal has not been issued, the first circuit receives the first address and outputs that first address to the row decoder circuit and then receives the second address and outputs that second address to the row decoder circuit, and, when a target row refresh signal has been issued, the first circuit receives the first address and outputs the third address to the row decoder circuit; and at least one controller that outputs the target row refresh signal and the address information to the semiconductor memory device.

8. The system as claimed in claim 7, wherein the at least one controller includes a plurality of counter circuits corresponding to the plurality of word lines in the memory array of the semiconductor memory device, and each counter circuit counts a number of times the corresponding word line is accessed.

9. The system as claimed in claim 7, further comprising:
another memory array that stores numbers of times each of the plurality of word lines of the memory array of the semiconductor memory device is accessed.

10. A semiconductor memory device, comprising:
a memory cell array having a plurality of word lines including a first and second word line arranged adjacent to one another; and
an address conversion circuit that selects the first word line when an address signal that represents a first value is input when the semiconductor memory device is in a first operation mode and that selects the second word line when an address signal that represents the first value is input when the semiconductor memory device is in a target row refresh mode.

11. The semiconductor memory device as claimed in claim 10, wherein the address conversion circuit is configured to select the second word line when an address signal that represents a second value is input when the semiconductor memory device is in the first operation mode and to select a word line other than the second word line when an address signal that represents the second value is input when the semiconductor memory device is in the target row refresh mode.

12. The semiconductor memory device as claimed in claim 11, wherein the word line other than the second word line is the first word line.

13. The semiconductor memory device as claimed in claim 11, wherein:
the plurality of word lines further includes a third word line arranged adjacent to the first word line on an opposite side of the first word line than the second word line; and
the address conversion circuit selects the third word line when an address signal that represents a third value is input when the semiconductor memory device is in the first operation mode and selects both the second and third word lines when an address signal that represents the first value is input when the semiconductor memory device is in the target row refresh mode.

14. The semiconductor memory device as claimed in claim 10, wherein the address conversion circuit is configured to transition from the first operation mode to the target row refresh mode when an externally generated target row refresh command is input.

15. The semiconductor memory device as claimed in claim 14, wherein the address conversion circuit transitions from the target row refresh mode to the first operation mode when an externally generated pre-charge command is input.

* * * * *